(12) United States Patent
Jang et al.

(10) Patent No.: US 10,103,170 B2
(45) Date of Patent: Oct. 16, 2018

(54) SEMICONDUCTOR DEVICE HAVING A VERTICAL PILLAR CONNECTED TO THE SUBSTRATE

(71) Applicant: Samsung Electronics Co., Ltd., Suwon-si, Gyeonggi-do (KR)

(72) Inventors: Byong-hyun Jang, Suwon-si (KR); Dongchul Yoo, Seongnam-si (KR); Woojin Jang, Suwon-si (KR); Jaeyoung Ahn, Seongnam-si (KR); Junkyu Yang, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/784,635

(22) Filed: Oct. 16, 2017

(65) Prior Publication Data

US 2018/0114794 A1 Apr. 26, 2018

(30) Foreign Application Priority Data

Oct. 26, 2016 (KR) .................. 10-2016-0140285

(51) Int. Cl.
| | |
|---|---|
| *H01L 27/11556* | (2017.01) |
| *H01L 27/11582* | (2017.01) |
| *H01L 23/528* | (2006.01) |
| *H01L 29/51* | (2006.01) |
| *H01L 27/11568* | (2017.01) |
| *H01L 21/311* | (2006.01) |
| *H01L 21/28* | (2006.01) |
| *H01L 29/10* | (2006.01) |
| *H01L 29/06* | (2006.01) |
| *H01L 21/762* | (2006.01) |
| *H01L 27/11565* | (2017.01) |

(52) U.S. Cl.
CPC .. *H01L 27/11582* (2013.01); *H01L 21/28282* (2013.01); *H01L 21/31111* (2013.01); *H01L 21/76224* (2013.01); *H01L 23/528* (2013.01); *H01L 27/11568* (2013.01); *H01L 29/0649* (2013.01); *H01L 29/1037* (2013.01); *H01L 29/513* (2013.01); *H01L 27/11565* (2013.01); *H01L 29/518* (2013.01)

(58) Field of Classification Search
CPC ......... H01L 27/11556; H01L 27/11568; H01L 27/11578; H01L 27/11582; H01L 29/792; H01L 29/7926
See application file for complete search history.

(56) References Cited

U.S. PATENT DOCUMENTS 7,679,133 B2 3/2010 Son et al.
8,482,049 B2 7/2013 Son et al.
(Continued)

*Primary Examiner* — Hoai V Pham
(74) *Attorney, Agent, or Firm* — Harness, Dickey & Pierce, P.L.C.

(57) ABSTRACT

A semiconductor device includes word lines vertically stacked on top of each other on a substrate, insulating patterns between the word lines, a vertical pillar connected to the substrate, and residual sacrificial patterns on the substrate at sides of the word lines. The vertical pillar penetrates the word lines and the insulating patterns. Each of the insulating patterns includes a first portion between the word lines and a second portion extending from the first portion and between the residual sacrificial patterns. A first thickness of the first portion is smaller than a second thickness of the second portion.

20 Claims, 45 Drawing Sheets

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 8,829,595 B2 | 9/2014 | Lee |
| 9,093,479 B2 | 7/2015 | Son et al. |
| 9,324,729 B2 | 4/2016 | Higuchi et al. |
| 2011/0233648 A1 | 9/2011 | Seol et al. |
| 2015/0263126 A1 | 9/2015 | Shingu et al. |
| 2015/0279857 A1 | 10/2015 | Kim et al. |
| 2016/0079269 A1 | 3/2016 | Sekine et al. |
| 2016/0104719 A1 | 4/2016 | Jung et al. |
| 2016/0118398 A1 | 4/2016 | Yon et al. |
| 2016/0155750 A1 | 6/2016 | Yasuda |
| 2018/0076210 A1* | 3/2018 | Hamada ............ H01L 27/11556 |

\* cited by examiner

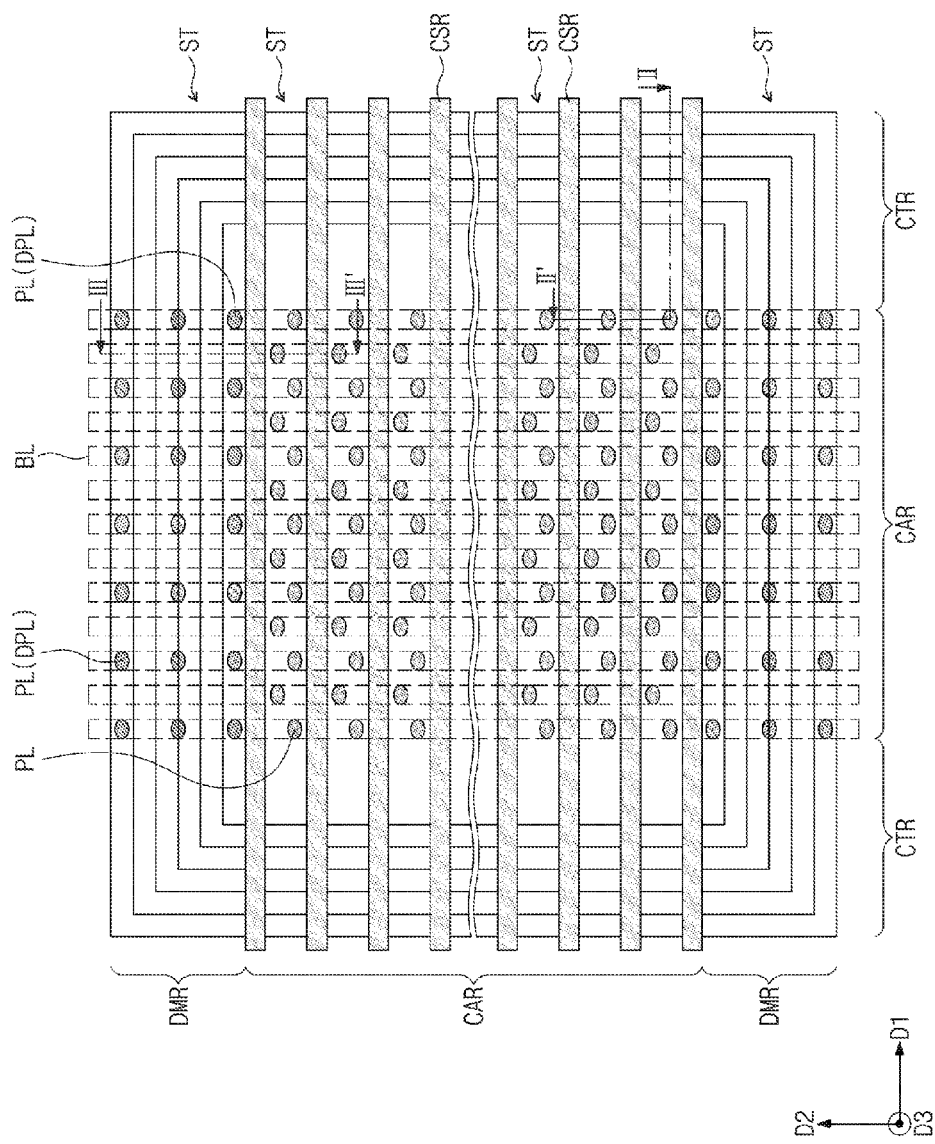

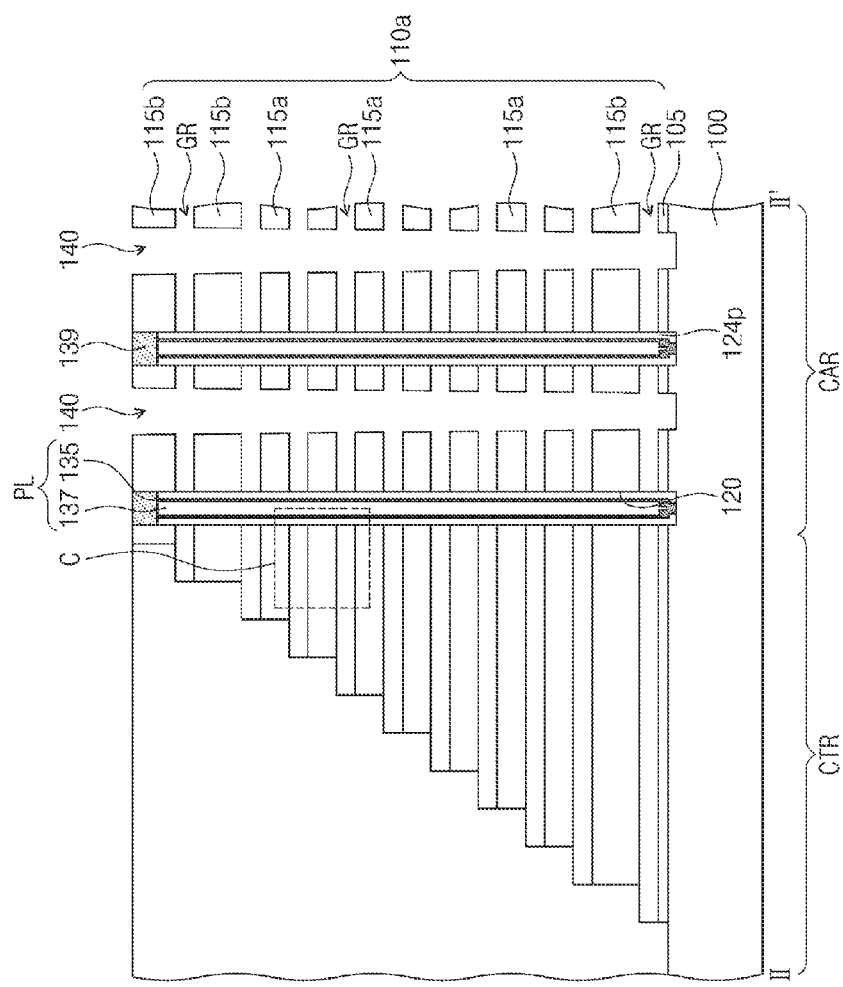

SEMICONDUCTOR DEVICE HAVING A VERTICAL PILLAR CONNECTED TO THE SUBSTRATE

CROSS-REFERENCE TO RELATED APPLICATION

This U.S. non-provisional patent application claims priority under 35 U.S.C. § 119 to Korean Patent Application No. 10-2016-0140285, filed on Oct. 26, 2016, in the Korean Intellectual Property Office, the disclosure of which is hereby incorporated by reference in its entirety.

BACKGROUND

Example embodiments of inventive concepts relate to a semiconductor device and a method for fabricating the same and, more particularly, to a three-dimensional (3D) semiconductor device including three-dimensionally arranged memory cells and a method for fabricating the same.

Semiconductor devices have been highly integrated to provide excellent performance and low fabrication costs. The integration density of semiconductor devices directly affects the costs of the semiconductor devices, thereby resulting in a demand of highly integrated semiconductor devices. The integration density of conventional two-dimensional (2D) or planar semiconductor devices may be mainly determined by an area where a unit memory cell occupies. Therefore, the integration density of the conventional 2D semiconductor devices may be greatly affected by a technique of forming fine patterns. However, since extremely high-priced apparatuses are needed to form fine patterns, the integration density of 2D semiconductor devices continues to increase but is still limited.

Three-dimensional (3D) semiconductor devices have been developed to overcome the above limitations. However, a cost per bit of 3D semiconductor devices may be expensive as compared with that of 2D semiconductor devices, and thus it may be desirable to develop a process technique capable of reducing the cost per bit.

SUMMARY

Example embodiments of inventive concepts may provide a semiconductor device with improved reliability and a method for fabricating the same.

In some example embodiments, a semiconductor device may include word lines vertically stacked on top of each other on a substrate; insulating patterns between the word lines, each of the insulating patterns including a first portion between the word lines and a second portion extending from the first portion, a first thickness of the first portion being smaller than a second thickness of the second portion; a vertical pillar connected to the substrate, the vertical pillar penetrating the word lines and the insulating patterns; and residual sacrificial patterns on the substrate at sides of the word lines, respectively, such that the second portions of the insulating patterns are between the residual sacrificial patterns.

In some example embodiments, a semiconductor device may include a substrate including a cell array region and a dummy region, a first stack structure on the substrate, a second stack structure on the substrate, and first and second vertical pillars connected to the substrate. The first stack structure includes first word lines vertically stacked on top of each other on the cell array region and first insulating patterns between the first word lines. The second stack structure includes second word lines vertically stacked on top of each other on the dummy region, second insulating patterns between the second word lines, and residual sacrificial patterns at sides of the second word lines, respectively. The first vertical pillars penetrate the first stack structure. The second vertical pillars penetrate the second stack structure. Each of the second insulating patterns may include a first portion between the second word lines, and a second portion extending from the first portion and between the residual sacrificial patterns. A first thickness of the first portion may be smaller than a second thickness of the second portion.

In some example embodiments, a method for fabricating a semiconductor device may include forming a thin-layer structure by alternately and repeatedly stacking sacrificial layers and insulating layers on a substrate, forming a vertical hole that penetrates the thin-layer structure and exposes the substrate, forming a vertical insulating pattern and a semiconductor pattern sequentially along a sidewall of the vertical hole, patterning the thin-layer structure to form isolation trenches that are spaced apart from the vertical hole and expose the substrate, forming gate regions by removing the sacrificial layers exposed through the isolation trenches, forming enlarged gate regions having vertical heights greater than vertical heights of the gate regions by removing portions of the vertical insulating pattern and portions of the insulating layers exposed through the gate regions, and forming gate electrodes in the enlarged gate regions. A first thickness of the insulating layers may be greater than a second thickness of the sacrificial layers.

According to some example embodiments, a semiconductor device includes a substrate including a cell array region, a plurality of word lines and a plurality of insulating patterns alternately stacked on top of each other on the substrate, a plurality of vertical pillars, a plurality of charge storage layers, a plurality of first blocking insulating layers and a plurality of second blocking insulating layers, and a plurality of protection patterns. A vertical distance between two adjacent insulating patterns among the plurality of insulating patterns is greater than a thickness of each of the two adjacent insulating patterns. The plurality of word lines and the plurality of insulating patterns define a plurality of vertical holes that are spaced apart from each other over the cell array region. The plurality of vertical pillars are in the plurality of vertical holes. The plurality of charge storage layers are in the plurality of vertical holes and surround the plurality of vertical pillars. The plurality of first blocking insulating layers are between the plurality of word lines and the plurality of charge storage layers. The plurality of second blocking insulating layers are between the plurality of first blocking layers and the plurality of charge storage layers. The plurality of protection patterns are between the plurality of charge storage layers and the plurality of insulating patterns such that the plurality of protection patters and the plurality of first blocking insulating layers are alternately stacked on top of each other.

BRIEF DESCRIPTION OF THE DRAWINGS

Inventive concepts will become more apparent in view of the attached drawings and accompanying detailed description.

FIGS. 6A to 14A are cross-sectional views corresponding to the line I-I' of FIG. 3 to illustrate a method for fabricating a semiconductor device, according to some example embodiments of inventive concepts.

FIGS. 6B to 14B are enlarged views corresponding to portions 'A' of FIGS. 6A to 14A, respectively.

FIG. 20 is a plan view illustrating a semiconductor device according to some example embodiments of inventive concepts.

FIGS. 22A and 23A are cross-sectional views corresponding to the line II-II' of FIG. 20 to illustrate a method for fabricating a semiconductor device, according to some example embodiments of inventive concepts.

DETAILED DESCRIPTION

Example embodiments of inventive concepts will be described hereinafter in detail with reference to the accompanying drawings.

Figure 1:
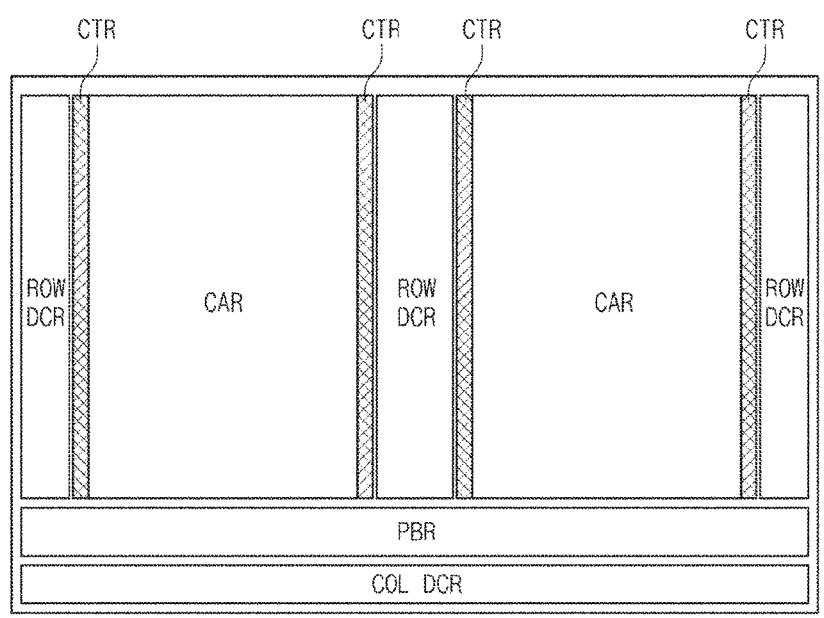
FIG. 1 is a schematic diagram illustrating a semiconductor device according to some example embodiments of inventive concepts.

FIG. 1 is a schematic diagram illustrating a semiconductor device according to some example embodiments of inventive concepts.

Referring to FIG. 1, a semiconductor device may include a cell array region CAR and a peripheral circuit region. The peripheral circuit region may include row decoder regions ROW DCR, a page buffer region PBR, a column decoder region COL DCR, and a control circuit region (not shown). In some example embodiments, a contact region CTR may be disposed between the cell array region CAR and the row decoder region ROW DCR.

A memory cell array including a plurality of memory cells may be disposed in the cell array region CAR. The memory cell array may include three-dimensionally arranged memory cells, word lines, and bit lines. The word lines and the bit lines may be electrically connected to the memory cells.

A row decoder for selecting the word lines of the memory cell array may be disposed in the row decoder region ROW DCR, and an interconnection structure for electrically connecting the memory cell array to the row decoder may be disposed in the contact region CTR. The row decoder may select one among the word lines of the memory cell array in response to an address signal. The row decoder may respectively provide a first word line voltage and second word line voltages to the selected word line and unselected word lines in response to a control signal of a control circuit.

A page buffer for sensing data stored in the memory cells may be disposed in the page buffer region PBR. According to an operation mode, the page buffer may temporarily store data to be stored in the memory cells or may sense data stored in the memory cells. The page buffer may operate as a write driver circuit in a program operation mode and may operate as a sense amplifier circuit in a read operation mode.

A column decoder connected to the bit lines of the memory cell array may be disposed in the column decoder region COL DCR. The column decoder may provide a data transmission path between the page buffer and an external device (e.g., a memory controller).

Figure 2:
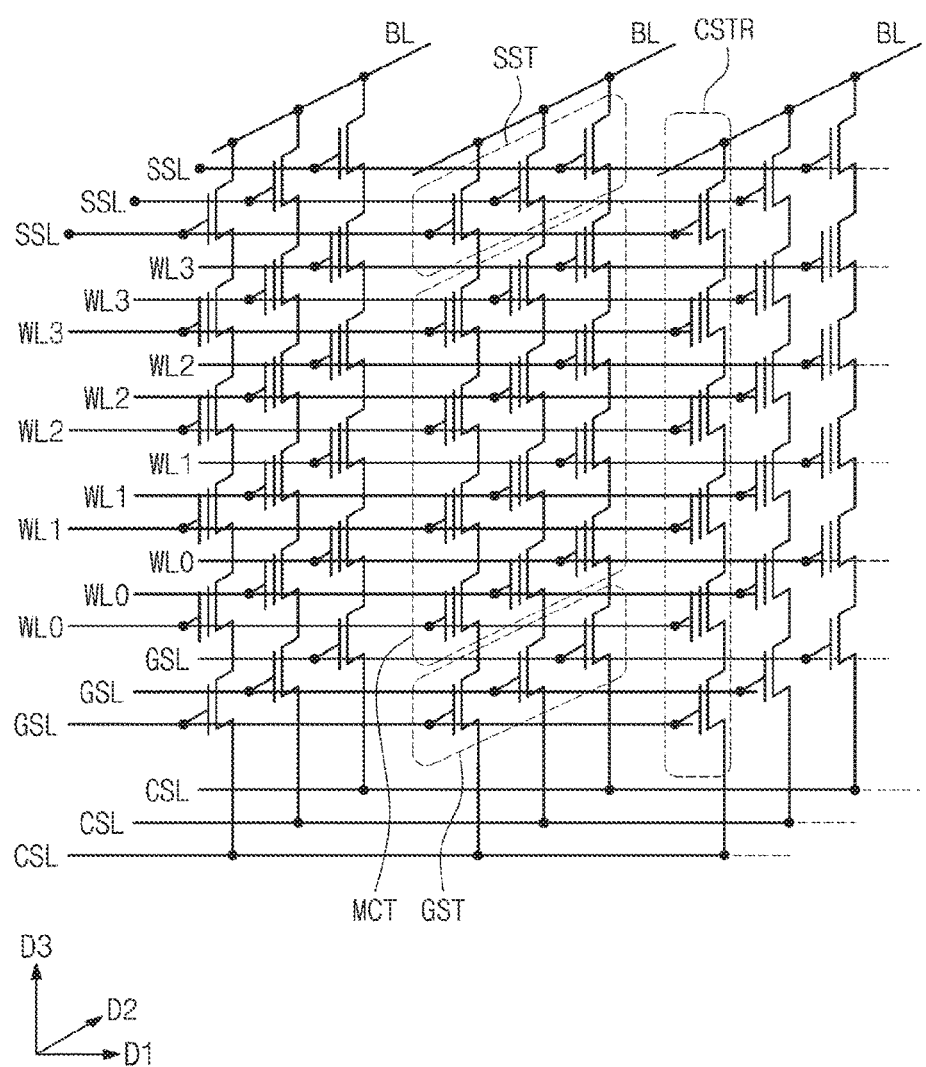
FIG. 2 is a circuit diagram illustrating a cell array of a semiconductor device according to some example embodiments of inventive concepts.

FIG. 2 is a circuit diagram illustrating a cell array of a semiconductor device according to some example embodiments of inventive concepts.

Referring to FIG. 2, a cell array may include a common source line CSL, a plurality of bit lines BL, and a plurality of cell strings CSTR disposed between the common source line CSL and the bit lines BL.

The bit lines BL may be two-dimensionally arranged when viewed from a plan view, and a plurality of the cell strings CSTR may be connected in parallel to each of the bit lines BL. The cell strings CSTR may be connected in common to the common source line CSL. In other words, a plurality of the cell strings CSTR may be disposed between one common source line CSL and a plurality of the bit lines BL. In some example embodiments, the common source line CSL may be provided in plurality, and the plurality of common source lines CSL may be two-dimensionally arranged when viewed from a plan view. In some example embodiments, the same voltage may be applied to the plurality of common source lines CSL. In some example embodiments, the common source lines CSL may be electrically controlled independently of each other.

Each of the cell strings CSTR may include a ground selection transistor GST connected to the common source line CSL, a string selection transistor SST connected to one of the bit lines BL, and a plurality of memory cell transistors MCT disposed between the ground and string selection transistors GST and SST. The ground selection transistor GST, the memory cell transistors MCT, and the string selection transistor SST may be connected in series to each other in the order named.

The common source line CSL may be connected in common to sources of the ground selection transistors GST. A ground selection line GSL, a plurality of word lines WL0 to WL3, and a string selection line SSL, which are disposed between the common source line CSL and the bit lines BL, may be used as a gate electrode of the ground selection transistor GST, gate electrodes of the memory cell transistors MCT, and a gate electrode of the string selection transistor SST, respectively. Each of the memory cell transistors MCT may include a data storage element.

Figure 3:
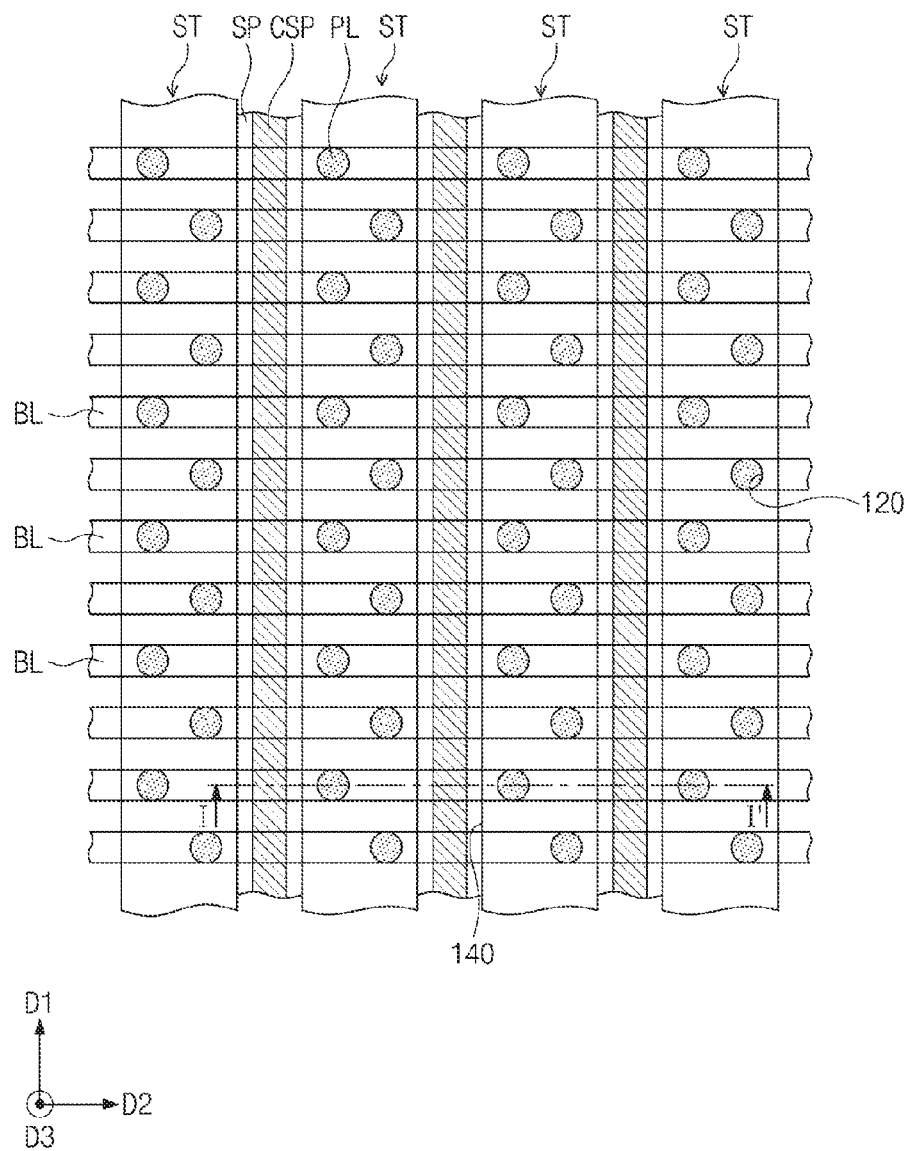
FIG. 3 is a plan view illustrating a semiconductor device according to some example embodiments of inventive concepts.
Figure 4:
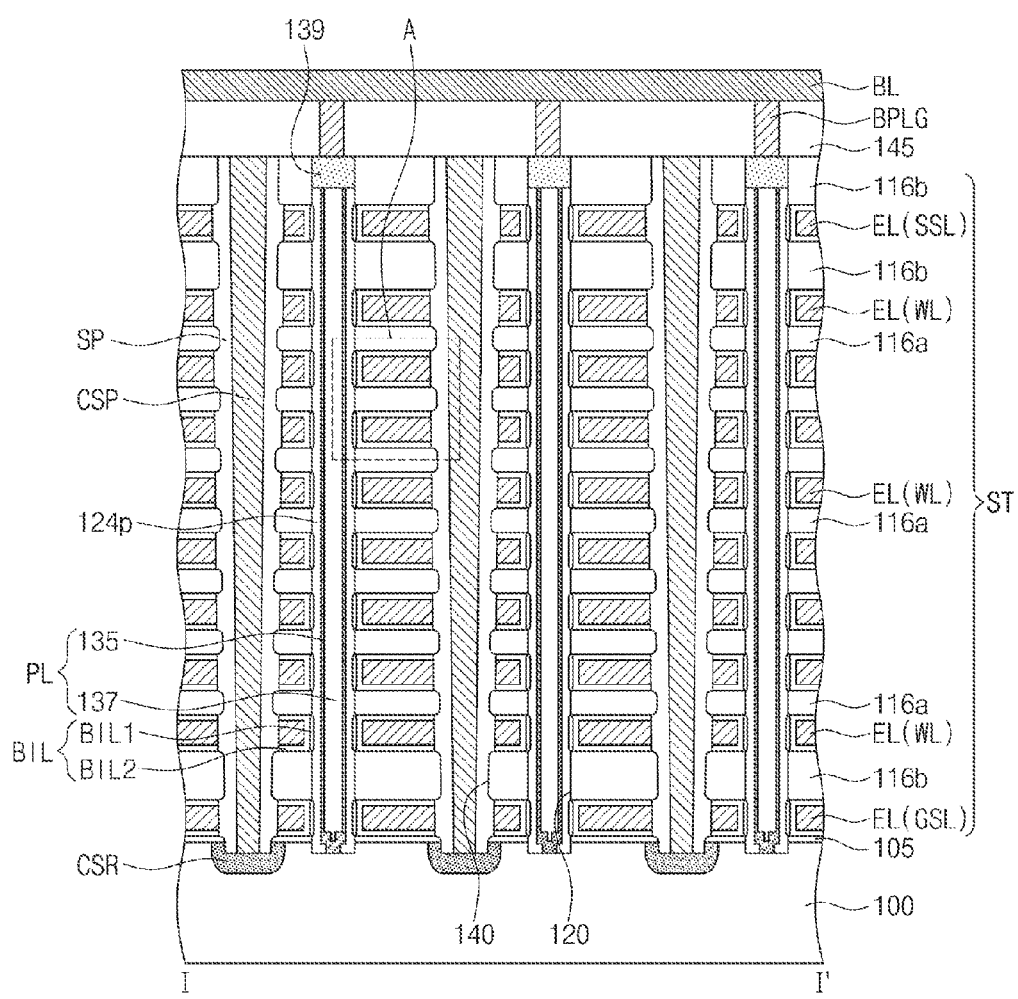
FIG. 4 is a cross-sectional view taken along a line I-I' FIG. 3.
Figure 5A:
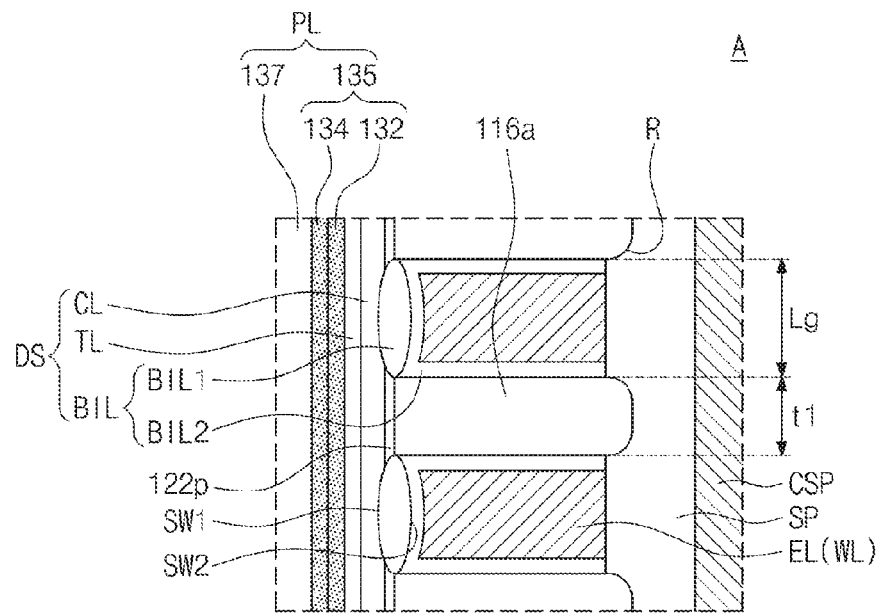
FIGS. 5A and 5B are enlarged views corresponding to a portion 'A' of FIG. 4.
Figure 5B:
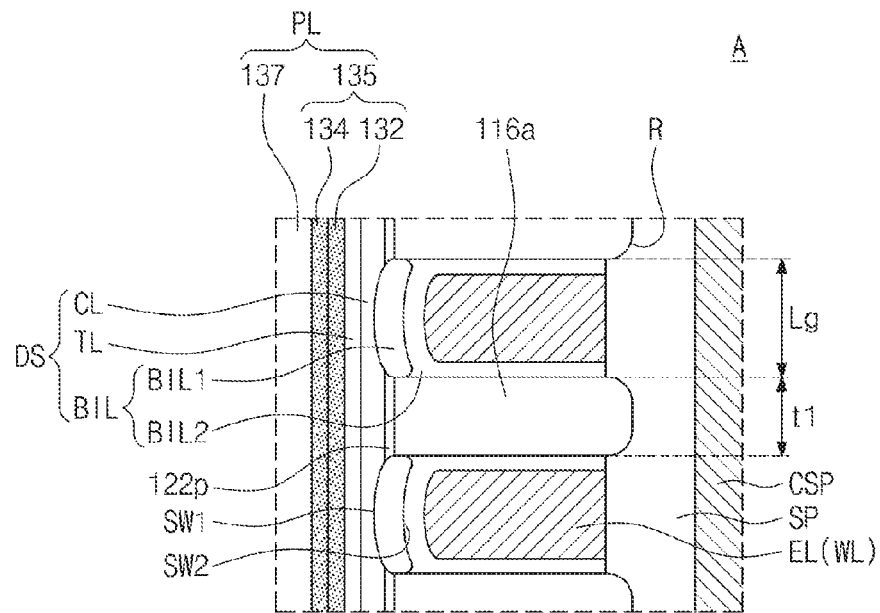

FIG. 3 is a plan view illustrating a semiconductor device according to some example embodiments of inventive concepts. FIG. 4 is a cross-sectional view taken along a line I-I' FIG. 3. FIGS. 5A and 5B are enlarged views corresponding to a portion 'A' of FIG. 4.

Referring to FIGS. 3, 4, and 5A, stack structures ST may be disposed on a substrate 100. The stack structures ST may extend in parallel in a first direction D1 and may be spaced apart from each other in a second direction D2 intersecting the first direction D1. The substrate 100 may be a semiconductor substrate having a first conductivity type (e.g., a P-type). The semiconductor substrate may include at least one of a single-crystalline silicon layer, a silicon-on-insulator (SOI), a silicon layer formed on a silicon-germanium (SiGe) layer, a single-crystalline silicon layer formed on an insulating layer, or a poly-crystalline silicon layer formed on an insulating layer.

Each of the stack structures ST may include gate electrodes EL vertically stacked on the substrate 100 and insulating patterns 116a and 116b disposed between the gate electrodes EL. For example, the gate electrodes EL may include a ground selection line GSL, word lines WL, and a string selection line SSL, which are sequentially stacked on the substrate 100. The ground selection line GSL, the word lines WL, and the string selection line SSL may constitute the cell string CSTR described with reference to FIG. 2. FIG. 4 illustrates one ground selection line GSL, one string selection line SSL, and eight word lines between the ground and string selection lines GSL and SSL. However, example embodiments of inventive concepts are not limited to the numbers of the ground selection line GSL, the word lines WL, and the string selection line SSL. In some example embodiments, the ground selection line GSL and the string selection line SSL may be provided in plurality and/or the number of the word lines WL may be 9 or more. The gate electrodes EL may include doped silicon, a metal (e.g., tungsten), a metal nitride, a metal silicide, or any combination thereof. Even though not shown in the drawings, end portions of the stack structure ST opposite to each other in the first direction D1 may have stepwise structures.

Thicknesses of the insulating patterns 116a and 116b in the stack structure ST may be varied according to characteristics of a semiconductor device. For example, one or some (e.g., the uppermost insulating pattern 116b, the insulating pattern 116b between the string selection line SSL and the uppermost word line WL, and/or the insulating pattern 116b between the ground selection line GSL and the lowermost word line WL) of the insulating patterns 116a and 116b may be thicker than the insulating patterns 116a between the word lines WL. For the purpose of ease and convenience in explanation, the insulating patterns 116a between the word lines WL may be defined as first insulating patterns 116a, and the other insulating patterns 116b may be defined as second insulating patterns 116b. In some example embodiments, the thicknesses of the insulating patterns 116a and 116b may be substantially equal to each other. The insulating patterns 116a and 116b may include, but not limited to, silicon oxide.

A buffer insulating layer 105 may be disposed between the substrate 100 and the stack structures ST. The buffer insulating layer 105 may include, for example, a silicon oxide layer. The buffer insulating layer 105 may be thinner than the insulating patterns 116a and 116b formed thereon.

A plurality of vertical holes 120 may penetrate each of the stack structures ST to expose the substrate 100, and vertical pillars PL may be provided in the vertical holes 120, respectively. In other words, a plurality of the vertical pillars PL may penetrate each of the stack structures ST and connect to the substrate 100. Each of the vertical pillars PL may have a long axis that extends upward from the substrate 100 (e.g., extends in a third direction D3). The vertical pillars PL may include semiconductor patterns 135 including a semiconductor material. Each of the semiconductor patterns 135 may have a full cylindrical shape or a hollow cylindrical shape (e.g., a macaroni shape). An inner space of the macaroni-shaped semiconductor pattern 135 may be filled with a filling insulation pattern 137. In this case, the vertical pillar PL may include the semiconductor pattern 135 and the filling insulation pattern 137. The filling insulation pattern 137 may be formed of, for example, silicon oxide. In some example embodiments, the semiconductor pattern 135 may include a first semiconductor pattern 132 and a second semiconductor pattern 134 sequentially stacked on a sidewall of the vertical hole 120, as illustrated in FIG. 5A. Each of the first and second semiconductor patterns 132 and 134 may include at least one of poly-crystalline silicon, single-crystalline silicon, or amorphous silicon. The semiconductor pattern 135 may be in an undoped state or may be doped with dopants having the same conductivity type as the substrate 100. Conductive pads 139 connected to bit line contact plugs BPLG may be disposed on top ends of the vertical pillars PL, respectively. The conductive pad 139 may be a dopant region doped with dopants or may be formed of a conductive material. Bottom ends of the vertical pillars PL may be inserted in the substrate 100.

The vertical pillars PL may be arranged along the first direction D1 to constitute a column. In some example embodiments, the vertical pillars PL penetrating one stack structure ST (or one string selection line SSL) may constitute a plurality of columns. For example, the vertical pillars PL constituting two columns may penetrate one string selection line SSL, as illustrated in FIGS. 3 and 4. However, example embodiments of inventive concepts are not limited thereto. In some example embodiments, the number of the columns of the vertical pillars PL penetrating one string selection line SSL may be 4, 8, or 9. In a pair of the columns adjacent to each other, the vertical pillars PL of one column may be shifted with respect to the vertical pillars PL of the other column adjacent thereto in the first direction D1. Thus, the vertical pillars PL of the pair of columns including the one column and the other column may be arranged in a zigzag form along the first direction D1.

An isolation trench 140 extending in the first direction D1 may be provided between the stack structures ST adjacent to each other. A common source region CSR may be provided in the substrate 100 exposed through the isolation trench 140. The common source region CSR may extend in the first direction D1 in the substrate 100. The common source region CSR may have a second conductivity type (e.g., an N-type) different from the first conductivity type. A common source plug CSP may be disposed in the isolation trench 140 so as to be connected to the common source region CSR.

Insulating spacers SP may be disposed between the common source plug CSP and the stack structures ST, respectively. For example, the common source plug CSP may have a substantially uniform upper width and may extend in the first direction D1. The insulating spacers SP may be disposed to face each other between the stack structures ST adjacent to each other. In some example embodiments, the insulating spacer SP may fill a space between the stack structures ST adjacent to each other, and the common source plug CSP may penetrate the insulating spacer SP so as to be locally connected to the common source region CSR.

In some example embodiments, a horizontal thickness (or a width) of each of the insulating patterns 116a and 116b of the stack structure ST may be greater than a horizontal thickness (or a width) of each of the gate electrodes EL of the stack structure ST. In other words, a horizontal distance from the common source plug CSP to a sidewall of each of the insulating patterns 116a and 116b adjacent thereto may be smaller than a horizontal distance from the common source plug CSP to a sidewall of each of the gate electrodes EL adjacent thereto. Thus, a sidewall of the stack structure ST adjacent to the common source plug CSP may have a plurality of recess regions. Here, each of the recess regions may be defined by vertically adjacent insulating patterns 116a and 116b and the gate electrode EL disposed therebetween, and the recess regions may be filled with the insulating spacer SP. According to some example embodiments of inventive concepts, end portions of the insulating patterns 116a and 116b adjacent to the common source plug CSP may have rounded corners R.

A data storage layer DS may be disposed between the stack structure ST and the vertical pillar PL. The data storage layer DS may include a tunnel insulating layer TL adjacent to the vertical pillar PL, a blocking insulating layer BIL adjacent to the stack structure ST, and a charge storage layer CL disposed between the tunnel insulating layer TL and the blocking insulating layer BIL. Data stored in the data storage layer DS may be changed by the Fowler-Nordheim tunneling induced by a difference in voltage between the vertical pillar PL including the semiconductor material and the gate electrodes EL.

The charge storage layer CL may include a charge trap layer or an insulating layer including conductive nanoparticles. For example, the charge storage layer CL may include at least one of a silicon nitride layer, a silicon oxynitride layer, a silicon-rich nitride layer, or a nanocrystalline silicon layer. The tunnel insulating layer TL may include at least one of materials of which energy band gaps are greater than that of the charge storage layer CL. For example, the tunnel insulating layer TL may include a silicon oxide layer. The charge storage layer CL and the tunnel insulating layer TL may extend along the vertical pillar PL in the third direction D3.

The blocking insulating layer BIL may include a first blocking insulating layer BIL1 and a second blocking insulating layer BIL2 which include materials different from each other. For example, the first blocking insulating layer BIL1 may include a silicon oxide layer, and the second blocking insulating layer BIL2 may include a high-dielectric layer such as an aluminum oxide layer and/or a hafnium oxide layer. According to some example embodiments of inventive concepts, the first blocking insulating layer BIL1 may be confined between the charge storage layer CL and each of the gate electrodes EL. In other words, the first blocking insulating layer BIL1 may have an island shape between the charge storage layer CL and each of the gate electrodes EL. A plurality of the first blocking insulating layers BIL1 may be oxide patterns formed by oxidizing portions of the charge storage layer CL horizontally overlapping with the gate electrodes EL.

In a cross-sectional view, each of the first blocking insulating layers BIL1 may have a first sidewall SW1 facing the charge storage layer CL, and a second sidewall SW2 facing the gate electrode EL. In some example embodiments, as illustrated in FIG. 5A, the first sidewall SW1 of the first blocking insulating layer BIL1 may have a convex shape toward the charge storage layer CL, and the second sidewall SW2 of the first blocking insulating layer BIL1 may have a convex shape toward the gate electrode EL. In some example embodiments, as illustrated in FIG. 5B, the first sidewall SW1 of the first blocking insulating layer BIL1 may have a convex shape toward the charge storage layer CL, but the second sidewall SW2 of the first blocking insulating layer BIL1 may have a concave shape toward the charge storage layer CL. However, example embodiments of inventive concepts are not limited thereto. In some example embodiments, the first sidewall SW1 may have a convex shape toward the charge storage layer CL, but the second sidewall SW2 may be formed to be bent or curved. A sidewall of the gate electrode EL facing the second sidewall SW2 may have a shape corresponding to the second sidewall SW2. For example, in the embodiment of FIG. 5A, the sidewall of the gate electrode EL facing the second sidewall SW2 may have a concave shape toward the common source plug CSP. In the embodiment of FIG. 5B, the sidewall of the gate electrode EL facing the second sidewall SW2 may have a convex shape toward the first blocking insulating layer BIL1.

The second blocking insulating layer BIL2 may be provided between each of the gate electrodes EL and the first blocking insulating layer BIL1 adjacent thereto. In addition, the second blocking insulating layer BIL2 may extend between the gate electrode EL and the insulating patterns 116a and 116b adjacent to the gate electrode EL, and thus the second blocking insulating layer BIL2 may cover a top surface and a bottom surface of the gate electrode EL.

Protection insulating patterns 122p may be disposed between the data storage layer DS and the insulating patterns 116a and 116b. Each of the protection insulating patterns 122p may horizontally overlap with each of the insulating patterns 116a and 116b and may be disposed between the first blocking insulating layers BIL1 vertically adjacent to each other. Each of the protection insulating patterns 122p may be in contact with the first blocking insulating layers BIL1 vertically adjacent thereto. The protection insulating patterns 122p may include the same material as the insulating patterns 116a and 116b, for example, silicon oxide.

A capping insulating layer 145 may cover the stack structures ST. Bit lines BL may be disposed on the capping insulating layer 145 and may extend in the second direction D2 to intersect the stack structures ST. The bit lines BL may be electrically connected to the vertical pillars PL through bit line contact plugs BPLG.

A thickness of the word line WL may correspond to a gate length of a memory cell. A sum of a thickness of the first insulating pattern 116a and thicknesses of a pair of the second blocking insulating layers BIL2 covering top and bottom surfaces of the first insulating pattern 116a may correspond to a distance between the word lines WL. A pitch of vertical memory cells may be defined by a sum of the thickness of the word line WL and the distance between the word lines WL. The pitch of the vertical memory cells may need to be uniformly limited to improve characteristics of the memory cells. For example, if the thickness of the word line WL is small, a resistance of the word line WL may increase. If the distance between the word lines WL is small, the first insulating pattern 116a may be broken down by a word line voltage.

When the thicknesses of the pair of second blocking insulating layers BIL2 covering the top and bottom surfaces of the first insulating pattern 116a are uniformly maintained, the thickness of the word line WL and the distance between the word lines WL may be adjusted by thicknesses of the first insulating patterns 116a or a distance between the first insulating patterns 116a. According to some example embodiments of inventive concepts, a distance Lg between the first insulating patterns 116a may be greater than a first thickness t1 of the first insulating pattern 116a, as illustrated in FIG. 5A or 5B. A ratio (Lg/t1) of the distance Lg to the first thickness t1 may be greater than 1. For example, the ratio of the distance Lg to the first thickness t1 may range from 1.2 to 1.6.

Generally, in a stack structure formed using a replacement process replacing the sacrificial layers with gate electrodes, when the Lg/t1 value is the same as described above, dispersion of memory cell characteristics may be increased by non-uniformity of diameters of vertical pillars. The semiconductor device according to some example embodiments of inventive concepts may be realized to satisfy a desired thickness of the word line WL and a desired distance between the word lines WL.

Figure 15:
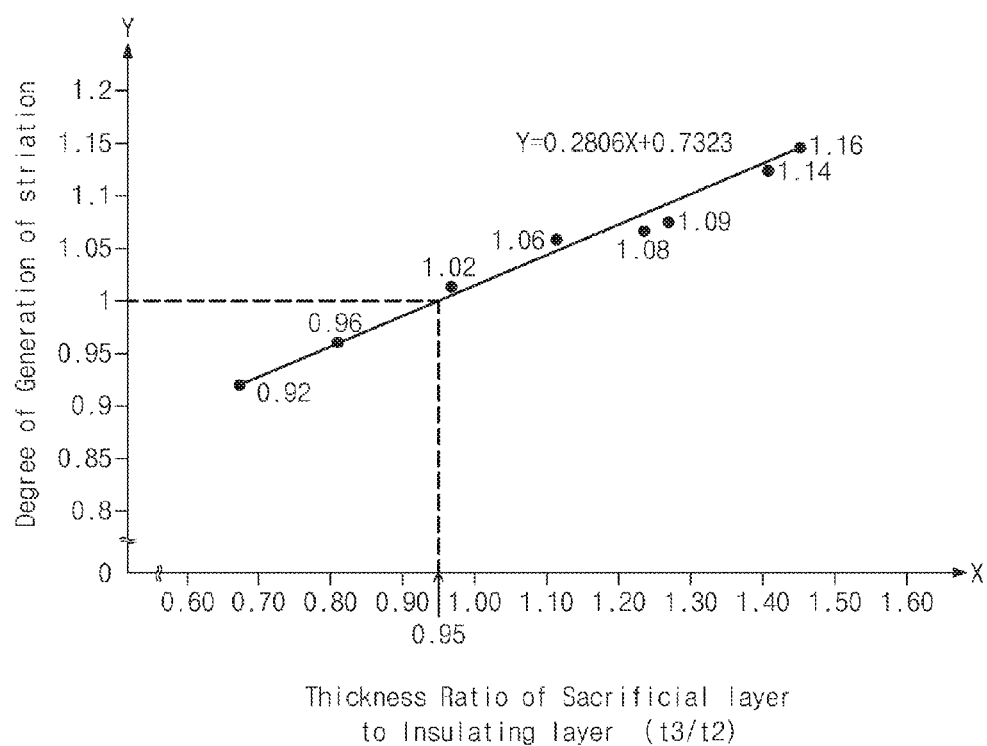
FIG. 15 is a graph illustrating a degree of generation of a striation according to a thickness ratio of a sacrificial layer to an insulating layer.
Figure 16:
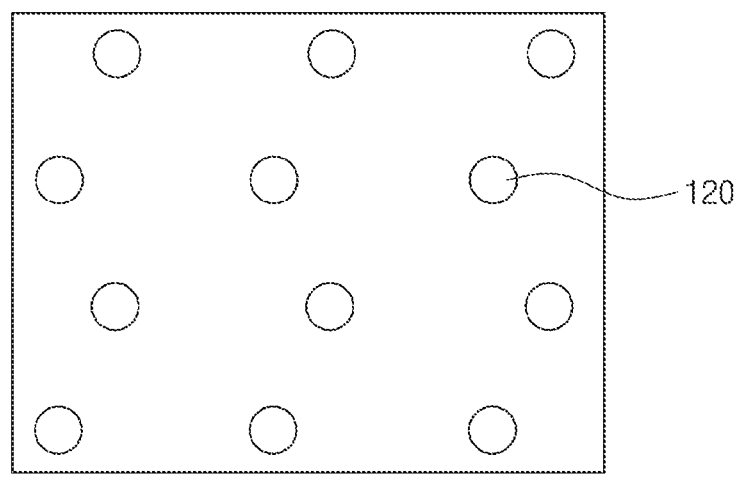
FIGS. 16 and 17 are plan views corresponding to a line A-A' of FIG. 7A.
Figure 17:
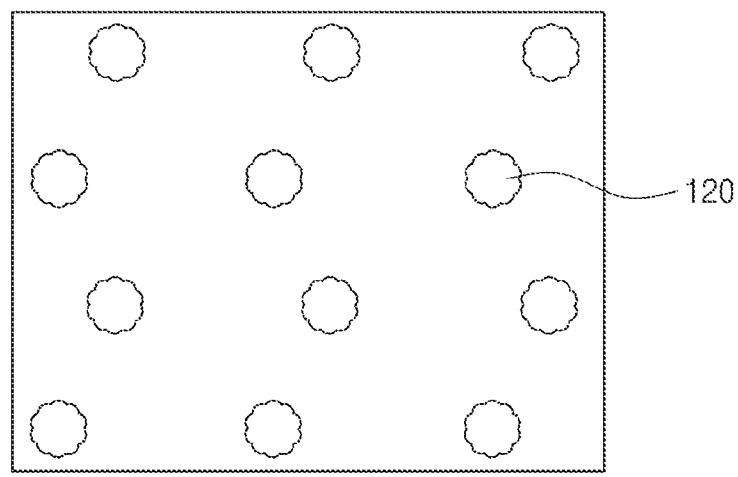

FIGS. 6A to 14A are cross-sectional views corresponding to the line I-I' of FIG. 3 to illustrate a method for fabricating a semiconductor device, according to some example embodiments of inventive concepts. FIGS. 6B to 14B are enlarged views corresponding to portions 'A' of FIGS. 6A to 14A, respectively. FIG. 15 is a graph illustrating a degree of generation of a striation according to a thickness ratio of a sacrificial layer to an insulating layer. FIGS. 16 and 17 are plan views corresponding to a line A-A' of FIG. 7A.

Figure 6A:
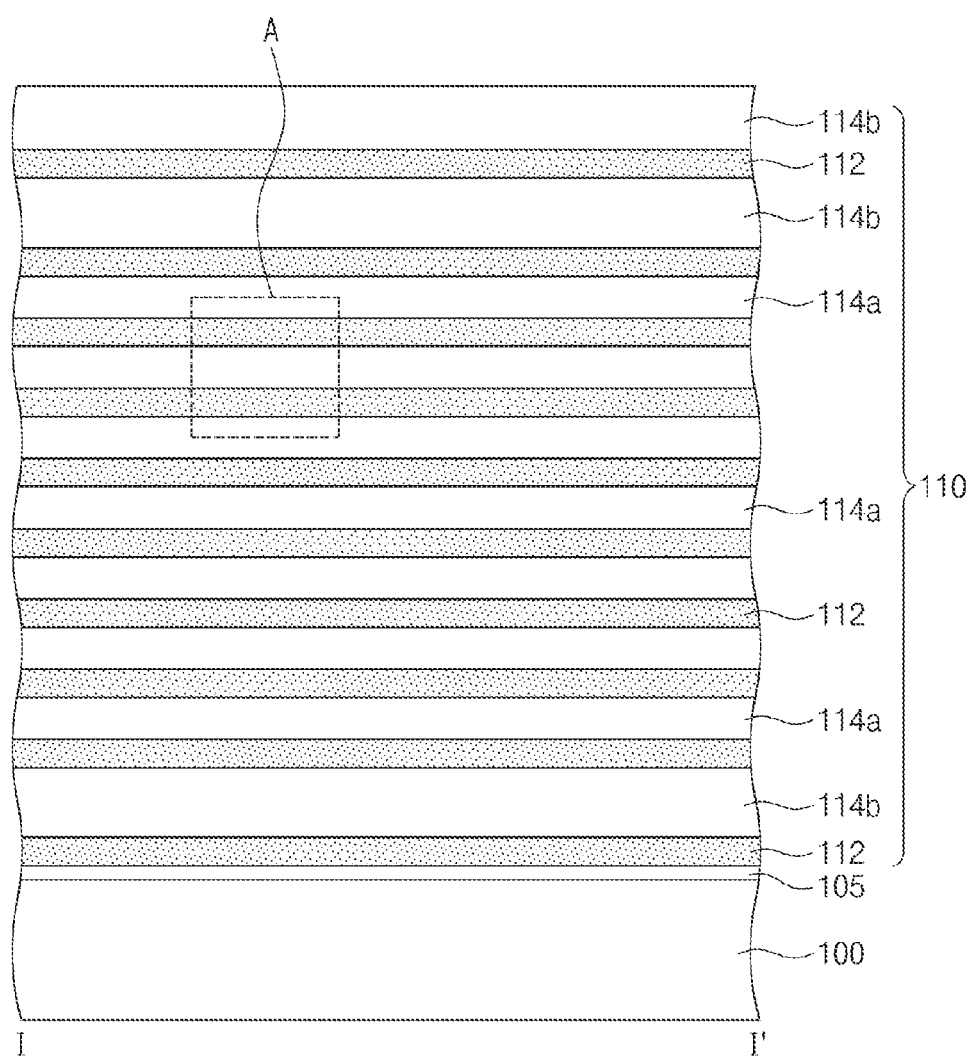
Figure 6B:
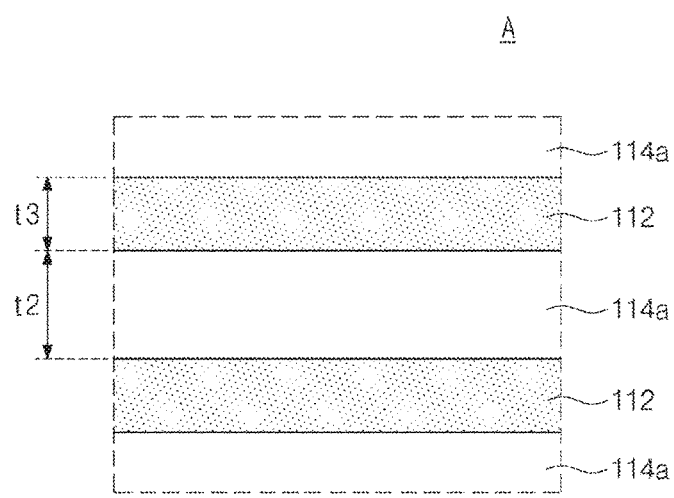

Referring to FIGS. 6A and 6B, sacrificial layers 112 and insulating layers 114a and 114b may be alternately and repeatedly stacked on a substrate 100 to form a thin-layer structure 110. The substrate 100 may be a semiconductor substrate having a first conductivity type (e.g., a P-type). The semiconductor substrate may include at least one of a single-crystalline silicon layer, a silicon-on-insulator (SOI), a silicon layer formed on a silicon-germanium (SiGe) layer, a single-crystalline silicon layer formed on an insulating layer, or a poly-crystalline silicon layer formed on an insulating layer.

In the thin-layer structure 110, the sacrificial layers 112 may be formed of a material having an etch selectivity with respect to the insulating layers 114a and 114b. For example, a difference between an etch rate of the sacrificial layers 112 and an etch rate of the insulating layers 114a and 114b may be large in a wet etching process using a chemical solution but may be small in a dry etching process using an etching gas.

For example, each of the sacrificial layers 112 may include at least one of a silicon layer, a silicon carbide layer, a silicon oxynitride layer, or a silicon nitride layer. Each of the insulating layers 114a and 114b may include at least one of a silicon layer, a silicon oxide layer, a silicon carbide layer, a silicon oxynitride layer, or a silicon nitride layer. At this time, the insulating layers 114a and 114b may include a different material from the sacrificial layers 112. In some example embodiments, each of the sacrificial layers 112 may be formed of a silicon nitride layer, and each of the insulating layers 114a and 114b may be formed of a silicon oxide layer. In some example embodiments, each of the sacrificial layers 112 may be formed of a silicon layer, and each of the insulating layers 114a and 114b may be formed of a silicon oxide layer. The sacrificial layers 112 and the insulating layers 114a and 114b may be formed by, for example, a chemical vapor deposition (CVD) method.

In some example embodiments, thicknesses of the sacrificial layers 112 may be equal to each other. Alternatively, the lowermost one and the uppermost one of the sacrificial layers 112 may be thicker than other sacrificial layers 112 interposed therebetween. The insulating layers 114a and 114b may have equal thicknesses, or a thickness of one or some of the insulating layers 114a and 114b may be different from those of others of the insulating layers 114a and 114b. For example, the insulating layers 114a and 114b may include first insulating layers 114a corresponding to the first insulating patterns 116a of FIG. 4 and second insulating layers 114b corresponding to the second insulating patterns 116b of FIG. 4, and the second insulating layers 114b may be thicker than the first insulating layers 114a.

According to some example embodiments of inventive concepts, the thicknesses of the sacrificial layers 112 may be smaller than the thicknesses of the first insulating layers 114a. For example, as illustrated in FIG. 6B, the first insulating layers 114a may have a second thickness t2, and the sacrificial layers 112 may have a third thickness t3 smaller than the second thickness t2. In some example embodiments, a ratio (t3/t2) of the thickness of the sacrificial layer 112 to the thickness of the first insulating layer 114a may range from 0.55 to 0.95. For example, the second thickness t2 may be about 32 nm, and the third thickness t3 may be about 19 nm, but example embodiments are not limited thereto.

A buffer insulating layer 105 may be formed on the substrate 100 before the formation of the thin-layer structure 110. For example, the buffer insulating layer 105 may be a silicon oxide layer formed by a thermal oxidation process. Alternatively, the buffer insulating layer 105 may be a silicon oxide layer formed using a deposition technique. The buffer insulating layer 105 may have a thickness smaller than those of the sacrificial layers 112 and the insulating layers 114a and 114b formed thereon.

Figure 7A:
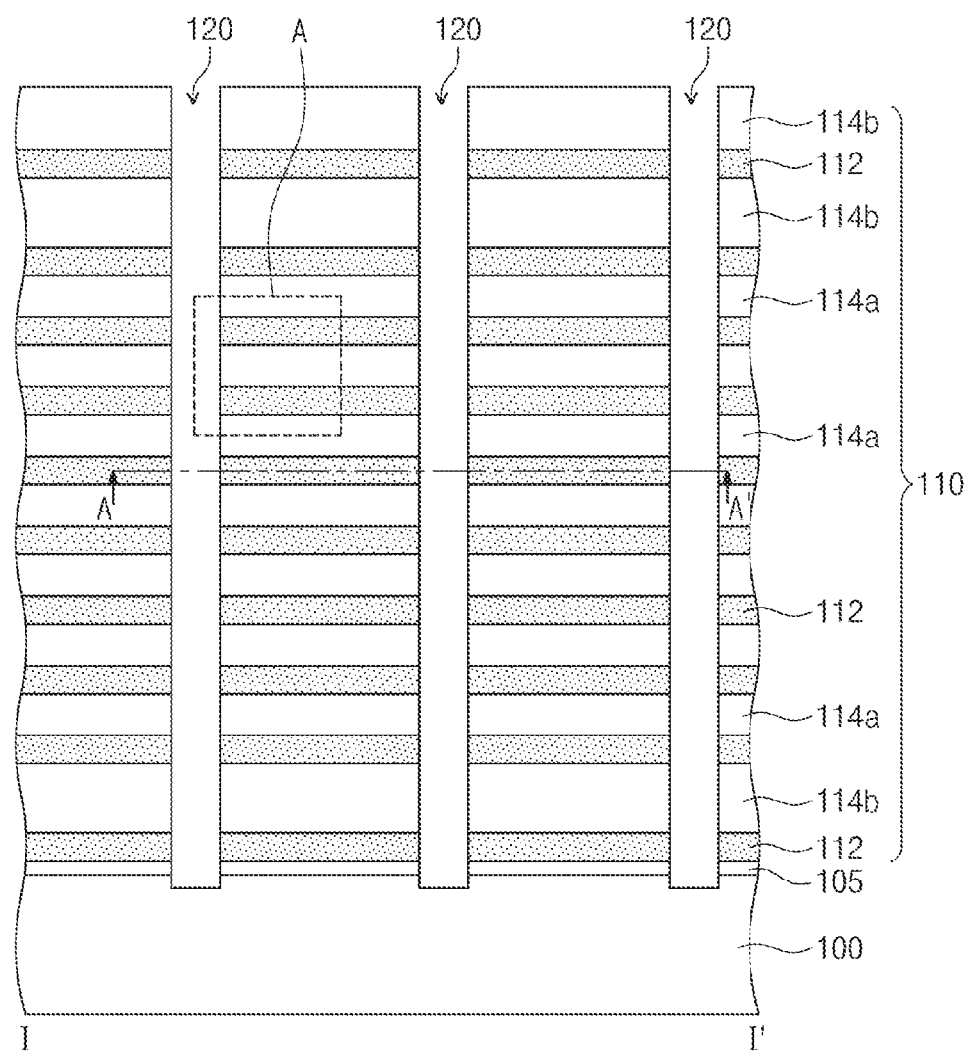
Figure 7B:
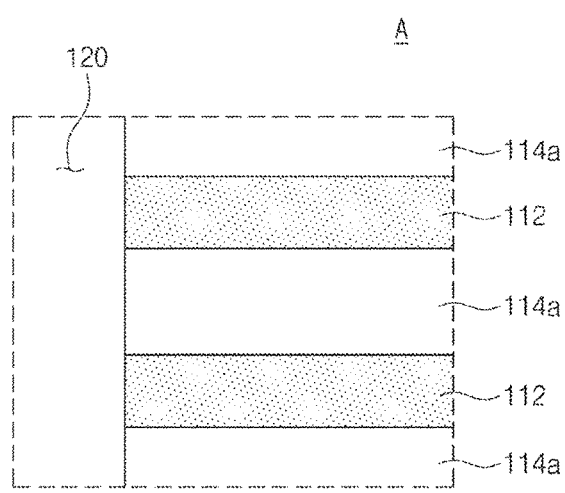

Referring to FIGS. 7A and 7B, vertical holes 120 may be formed to penetrate the thin-layer structure 110. The vertical holes 120 may expose the substrate 100.

In some example embodiments, a mask pattern (not shown) may be formed on the thin-layer structure 110, and an anisotropic etching process using the mask pattern as an etch mask may be performed on the thin-layer structure 110 to form the vertical holes 120. A top surface of the substrate 100 may be etched by over-etching of the anisotropic etching process, and thus the substrate 100 under the vertical holes 120 may be recessed by a desired (and/or alternatively predetermined) depth. The vertical holes 120 may be two-dimensionally formed when viewed from a plan view. In some example embodiments, the vertical holes 120 may be arranged in a zigzag form along the first direction D1, as illustrated in FIG. 3. However, example embodiments of inventive concepts are not limited thereto.

Figure 8A:
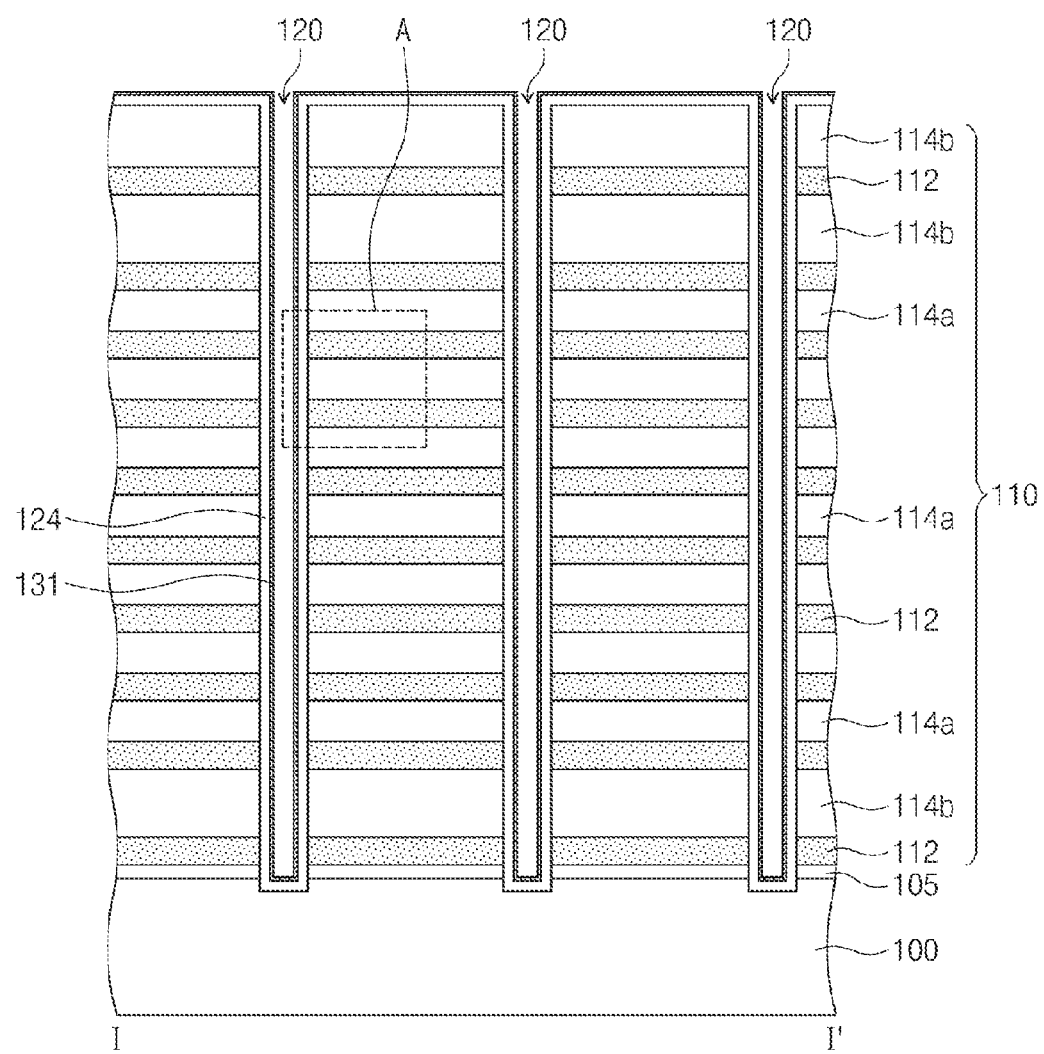
Figure 8B:
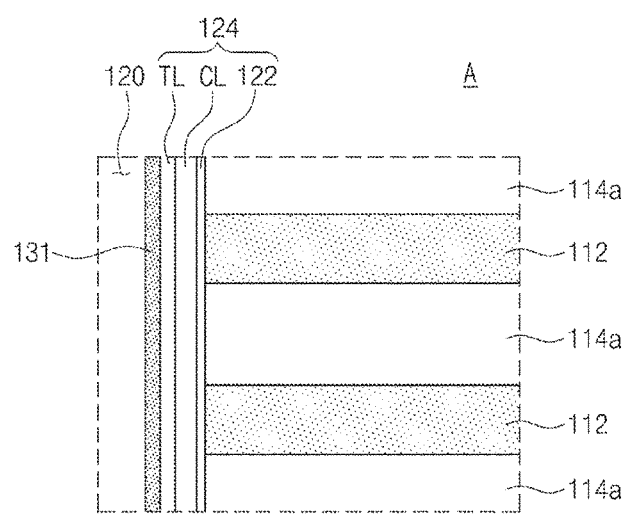

Referring to FIGS. 8A and 8B, a protection insulating layer 122, a charge storage layer CL, and a tunnel insulating layer TL may be sequentially formed on sidewalls (or inner sidewalls) of the vertical holes 120.

The protection insulating layer 122 may be formed on the sidewalls of the vertical holes 120 and may be in contact with the sacrificial layers 112 and the insulating layers 114a and 114b. The protection insulating layer 122 may be formed of the same material (e.g., a silicon oxide layer) as the insulating layers 114a and 114b. The charge storage layer CL may be formed on the protection insulating layer 122. The charge storage layer CL may include a charge trap layer or an insulating layer including conductive nano-particles. For example, the charge storage layer CL may include at least one of a silicon nitride layer, a silicon oxynitride layer, a silicon-rich nitride layer, or a nano-crystalline silicon layer. The tunnel insulating layer TL may include at least one of materials of which energy band gaps are greater than that of the charge storage layer CL. For example, the tunnel insulating layer TL may include a silicon oxide layer. The protection insulating layer 122, the tunnel insulating layer TL, and the charge storage layer CL may be formed by an atomic layer deposition (ALD) method or a CVD method and may be formed to partially fill the vertical holes 120. The protection insulating layer 122, the tunnel insulating layer TL, and the charge storage layer CL may be defined as a vertical insulating layer 124.

A first semiconductor layer 131 may be formed on the tunnel insulating layer TL. The first semiconductor layer 131 may be formed of a semiconductor material (e.g., poly-crystalline silicon, single-crystalline silicon, or amorphous silicon) by an ALD method or a CVD method. The first semiconductor layer 131 may cover the vertical insulating layer 124 to limit and/or prevent the vertical insulating layer 124 from being damaged in a subsequent etching process.

Figure 9A:
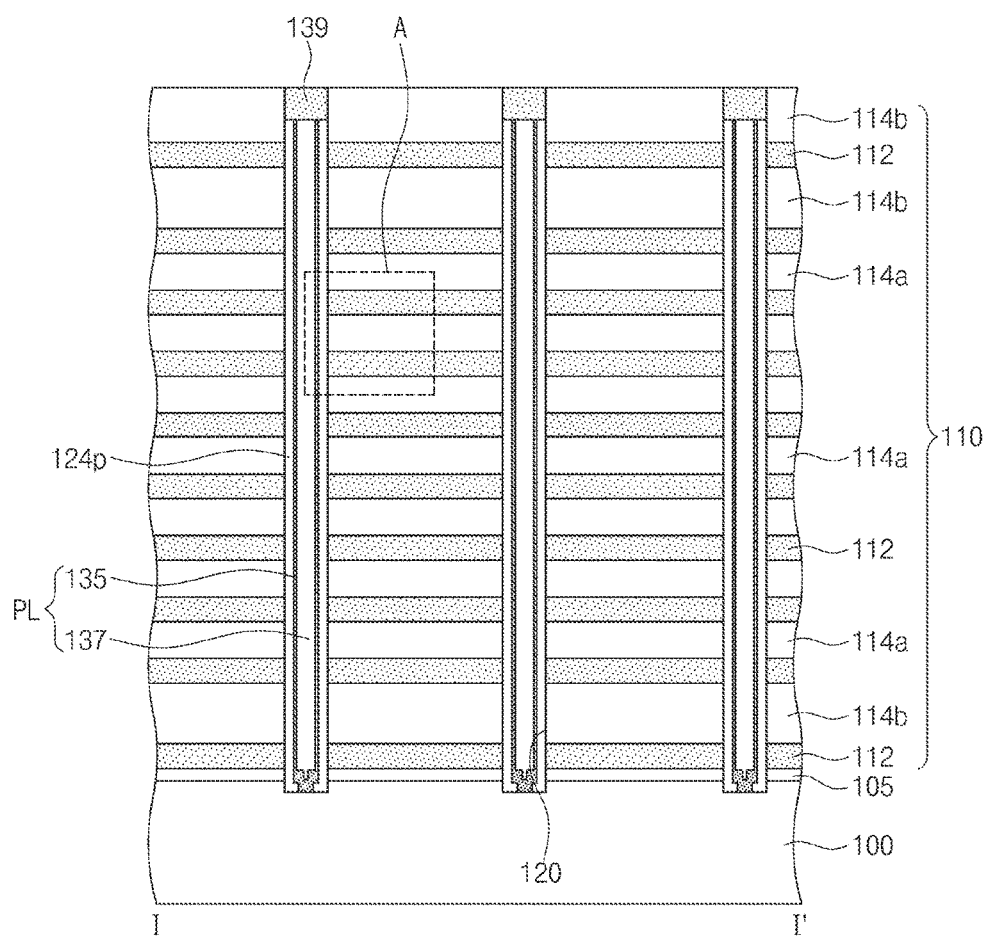
Figure 9B:
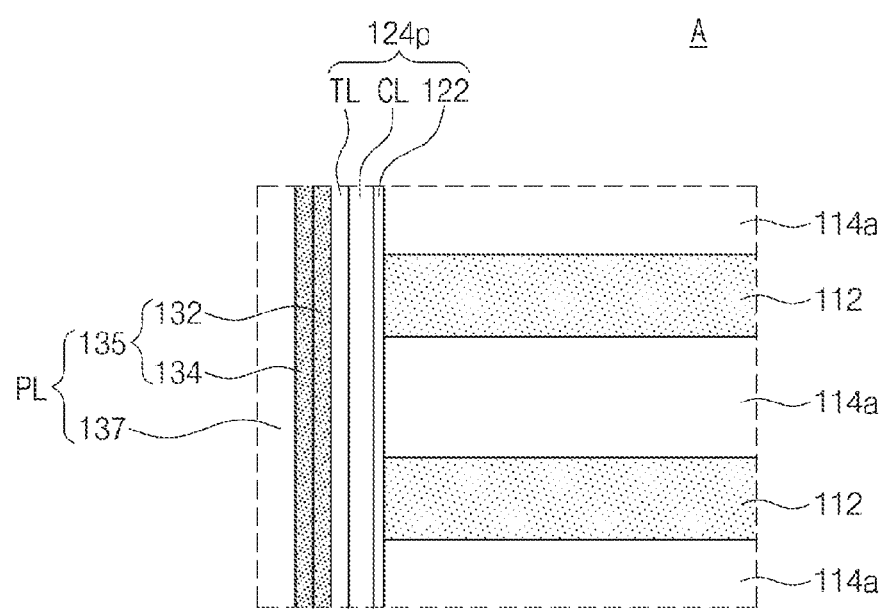

Referring to FIGS. 9A and 9B, the first semiconductor layer 131 and the vertical insulating layer 124 disposed on bottom surfaces of the vertical holes 120 may be anisotropically etched to expose the top surface of the substrate 100. Thus, a first semiconductor pattern 132 and a vertical insulating pattern 124p may be formed on the inner sidewall of each of the vertical holes 120. The vertical insulating pattern 124p and the first semiconductor pattern 132 may have a cylindrical shape having opened both ends. A portion of the vertical insulating layer 124 disposed under the first semiconductor pattern 132 may not be etched during the anisotropic etching process of the first semiconductor layer 131 and the vertical insulating layer 124. In this case, the vertical insulating pattern 124p may have a bottom portion disposed between a bottom surface of the first semiconductor pattern 132 and the top surface of the substrate 100. In addition, a top surface of the thin-layer structure 110 may also be exposed by the anisotropic etching process performed on the first semiconductor layer 131 and the vertical insulating layer 124. Thus, the vertical insulating pattern 124p and the first semiconductor pattern 132 may be confined in each of the vertical holes 120.

A second semiconductor pattern 134 and a filling insulation pattern 137 may be sequentially formed in each of the vertical holes 120. For example, a second semiconductor layer and a filling insulation layer may be sequentially formed in the vertical holes 120 having the vertical insulating pattern 124p and the first semiconductor pattern 132, and the second semiconductor layer and the filling insulation layer may be planarized until the top surface of the thin-layer structure 110 is exposed, thereby forming the second semiconductor pattern 134 and the filling insulation pattern 137. The second semiconductor layer may include a semiconductor material (e.g., a poly-crystalline silicon layer, a single-crystalline silicon layer, or an amorphous silicon layer) formed using an ALD process or a CVD process. The first and second semiconductor patterns 132 and 134 may be referred to as a semiconductor pattern 135. The semiconductor pattern 135 and the filling insulation pattern 137 may constitute a vertical pillar PL. For example, the semiconductor pattern 135 may be in an undoped state or may be doped with dopants having the same conductivity type as the substrate 100. In some example embodiments, the second semiconductor pattern 134 may be formed to fill each of the vertical holes 120, unlike FIGS. 9A and 9B. In this case, the filling insulation pattern 137 may be omitted.

Conductive pads 139 connected to the vertical pillars PL may be formed. Upper portions of the vertical pillars PL may be recessed, and the conductive pads 139 may be formed by filling the recessed regions with a conductive material. In addition, the conductive pads 139 may be doped with dopants having a different conductivity type from the vertical pillars PL disposed thereunder. Thus, the conductive pads 139 and the vertical pillars PL may constitute diodes.

Figure 10A:
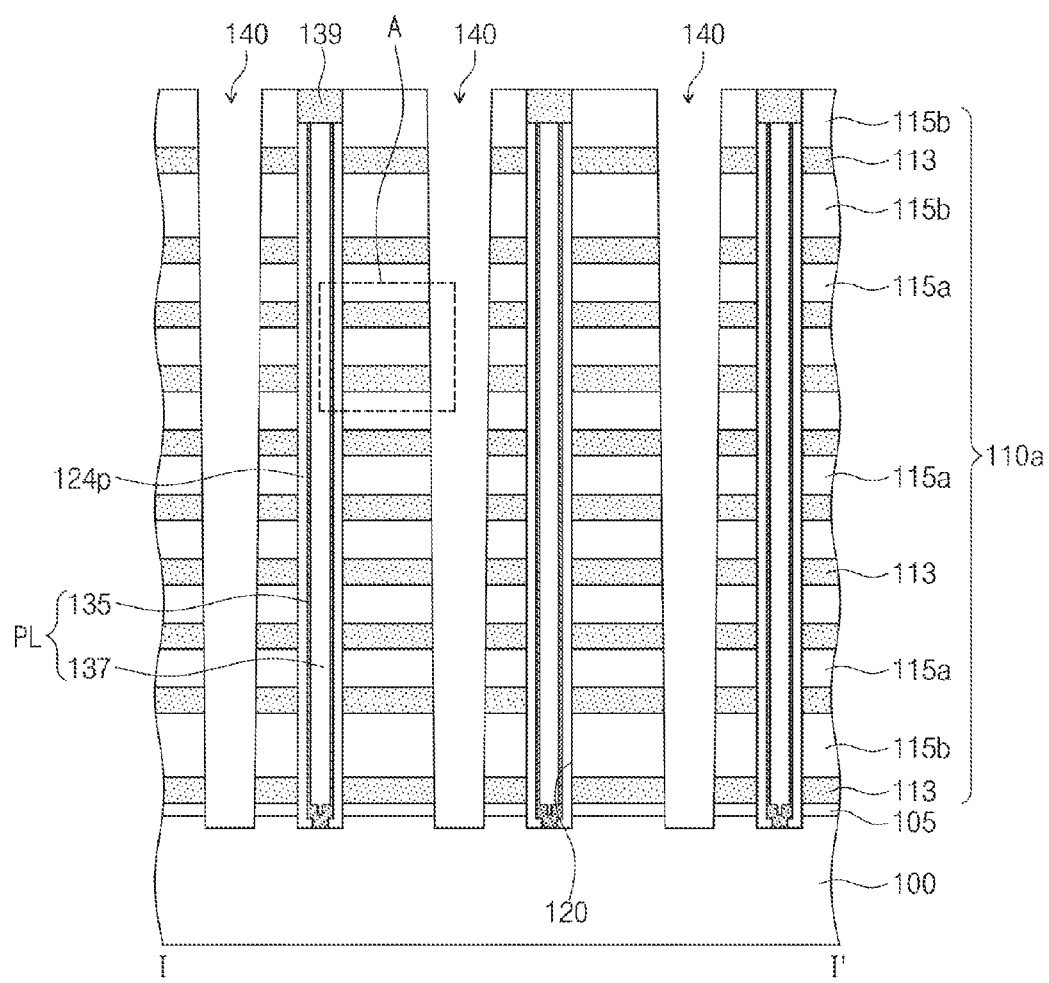
Figure 10B:
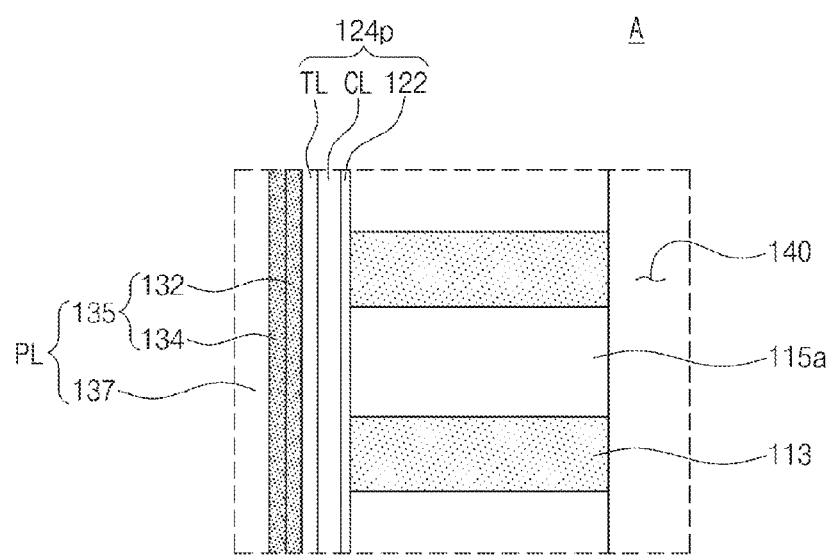

Referring to FIGS. 10A and 10B, the thin-layer structure 110 may be patterned to form isolation trenches 140 exposing the substrate 100.

For example, the patterning process of the thin-layer structure 110 may include forming a mask pattern (not shown) on the thin-layer structure 110, and sequentially etching the insulating layers 114a and 114b, the sacrificial layers 112, and the buffer insulating layer 105 by using the mask pattern as an etch mask. As illustrated in FIG. 3, the isolation trench 140 may be formed to have a linear or rectangular shape extending in the first direction D1. The top surface of the substrate 100 exposed through the isolation trenches 140 may be recessed by a desired (and/or alternatively predetermined) depth by over-etching during the formation of the isolation trenches 140.

Preliminary stack structures 110a including patterned sacrificial layers 113 and patterned insulating layers 115a and 115b may be formed by the formation of the isolation trenches 140. The patterned sacrificial layers 113 may be defined as sacrificial patterns 113, and the patterned insulating layers 115a and 115b may be defined as preliminary insulating patterns 115a and 115b. The preliminary stack structures 110a may have line shapes extending in the first direction D1 in a plan view and may be spaced apart from each other with the isolation trench 140 interposed therebetween in the second direction D2. The vertical pillars PL constituting a plurality of columns may penetrate one line-shaped preliminary stack structure 110a.

Figure 11A:
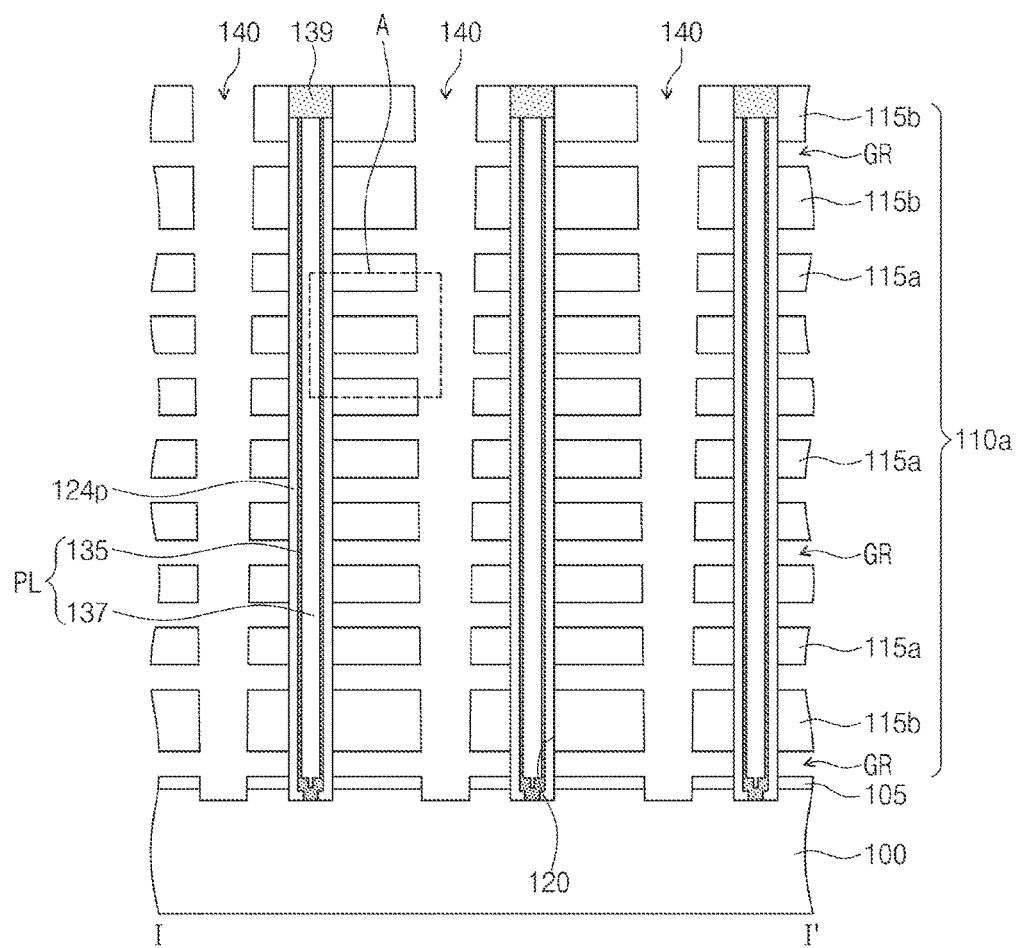
Figure 11B:
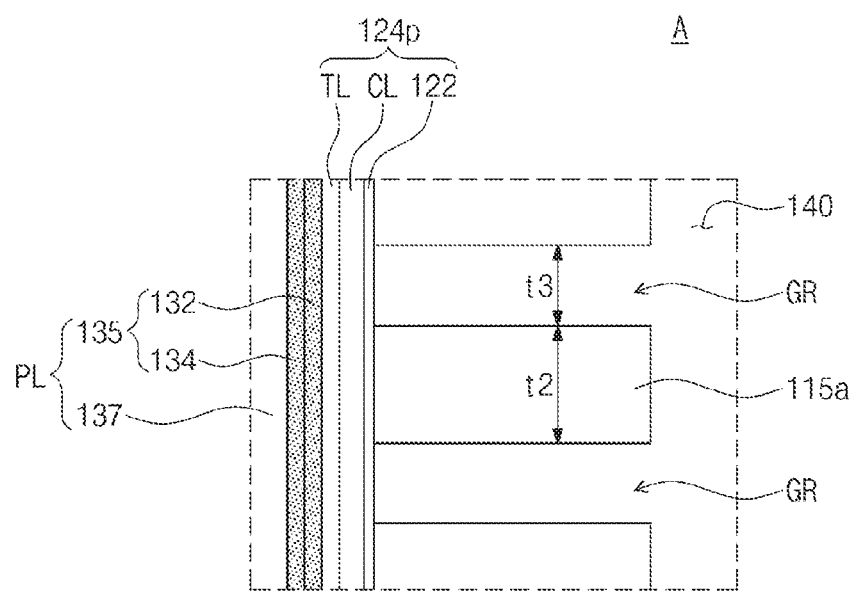

Referring to FIGS. 11A and 11B, the sacrificial patterns 113 exposed by the isolation trenches 140 may be removed to form gate regions GR between the preliminary insulating patterns 115a and 115b.

The gate regions GR may be formed by selectively removing the sacrificial patterns 113 disposed between the preliminary insulating patterns 115a and 115b. The selective removal of the sacrificial patterns 113 may be performed using a first isotropic etching process. In some example embodiments, when the sacrificial patterns 113 include silicon nitride and the preliminary insulating patterns 115a and 115b include silicon oxide, the first isotropic etching process may be performed using an etching solution including phosphoric acid. The gate regions GR may laterally extend from the isolation trench 140 into between the preliminary insulating patterns 115a and 115b and may expose an outer sidewall of the protection insulating layer 122. In other words, each of the gate regions GR may be defined by the preliminary insulating patterns 115a and 115b vertically adjacent to each other and the outer sidewall of the protection insulating layer 122. The protection insulating layer 122 may limit and/or prevent the charge storage layer CL from being damaged by the etching solution for the removal of the sacrificial patterns 113.

Figure 12A:
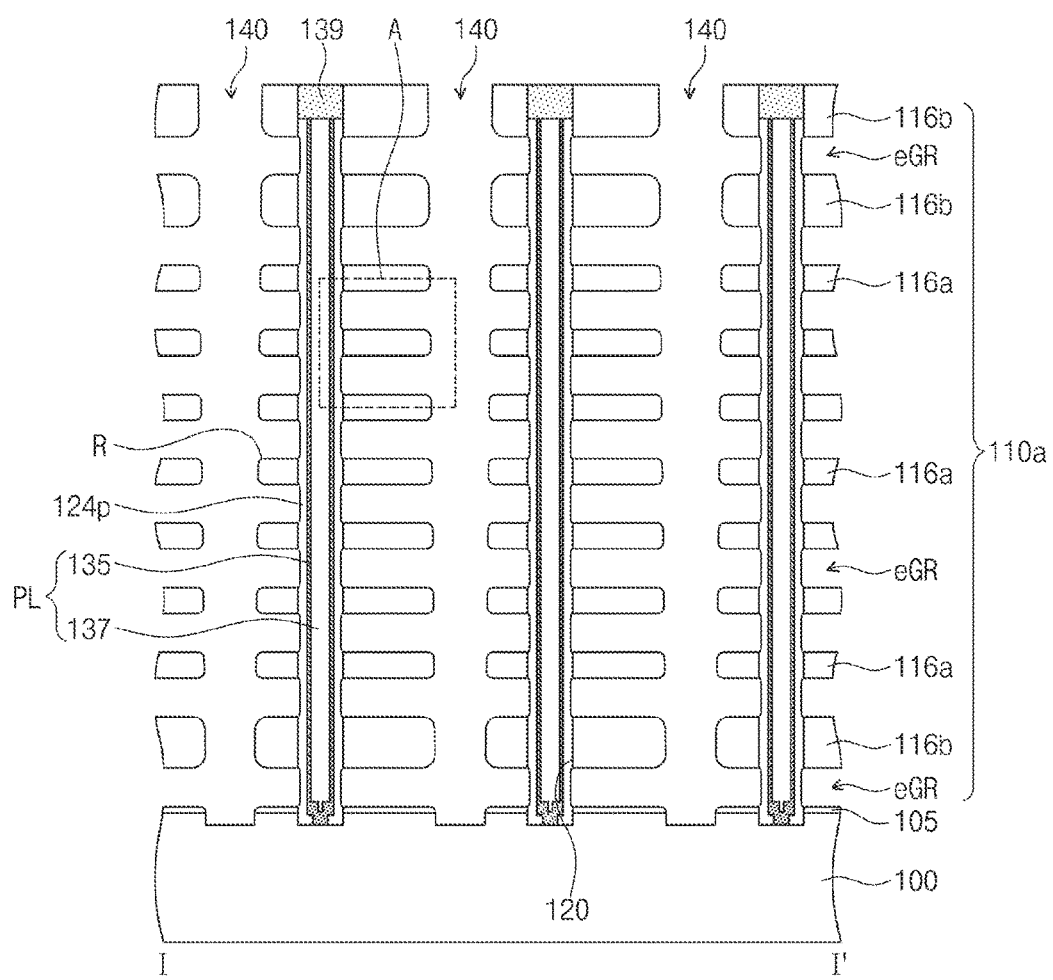
Figure 12B:
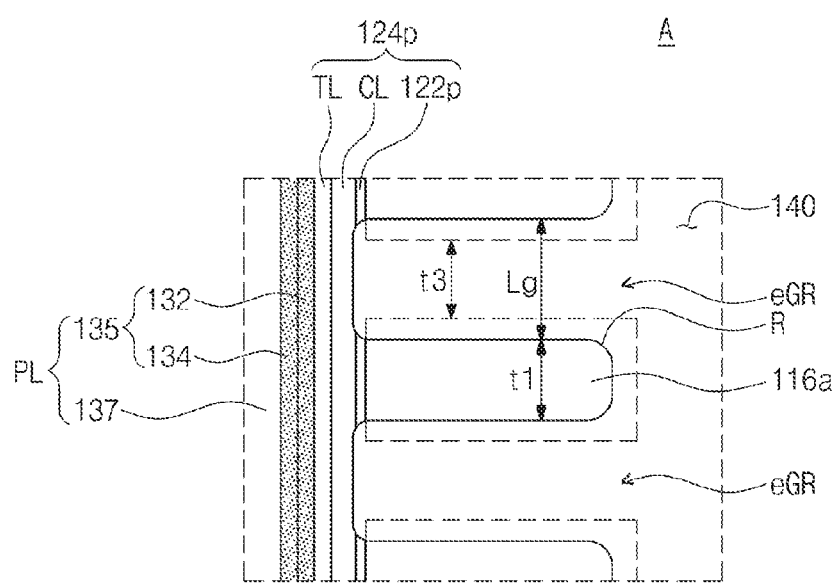

Referring to FIGS. 12A and 12B, portions of the protection insulating layer 122 and the preliminary insulating patterns 115a and 115b exposed by the gate regions GR may be removed to form enlarged gate regions eGR. The removal of the portions of the protection insulating layer 122 and the preliminary insulating patterns 115a and 115b may be performed using a second isotropic etching process. When the protection insulating layer 122 and the preliminary insulating patterns 115a and 115b include silicon oxide, the second isotropic etching process may be performed using an etching solution including hydrofluoric acid (HF).

Insulating patterns 116a and 116b may be formed from the preliminary insulating patterns 115a and 115b by the second isotropic etching process. Vertical thicknesses and horizontal thicknesses (or widths) of the insulating patterns 116a and 116b may be smaller than vertical thicknesses and horizontal thicknesses (or widths) of the preliminary insulating patterns 115a and 115b. As illustrated in FIGS. 11B and 12B, the first insulating pattern 116a may have a first thickness t1 smaller than a second thickness t2 of the first preliminary insulating pattern 115a. For example, the second thickness t2 may be about 32 nm, and the first thickness t1 may be about 19 nm. In other words, a vertical height of the enlarged gate region eGR (e.g., a distance Lg between the first insulating patterns 116a) may be greater than a vertical height of the gate region GR (e.g., a third thickness t3 of the sacrificial pattern 113). In addition, corners of the insulating patterns 116a and 116b adjacent to the isolation trench 140 may become rounded during the second isotropic etching process.

Moreover, the protection insulating layer 122 may be vertically divided to form protection insulating patterns 122p. Each of the protection insulating patterns 122p may have an island shape disposed between the charge storage layer CL and each of the insulating patterns 116a and 116b. Thus, each of the enlarged gate regions eGR may laterally extend between the protection insulating patterns 122p to expose an outer sidewall of the charge storage layer CL. In other words, each of the enlarged gate regions eGR may be defined by vertically adjacent insulating patterns 116a and 116b, vertically adjacent protection insulating patterns 122p, and the outer sidewall of the charge storage layer CL.

Figure 13A:
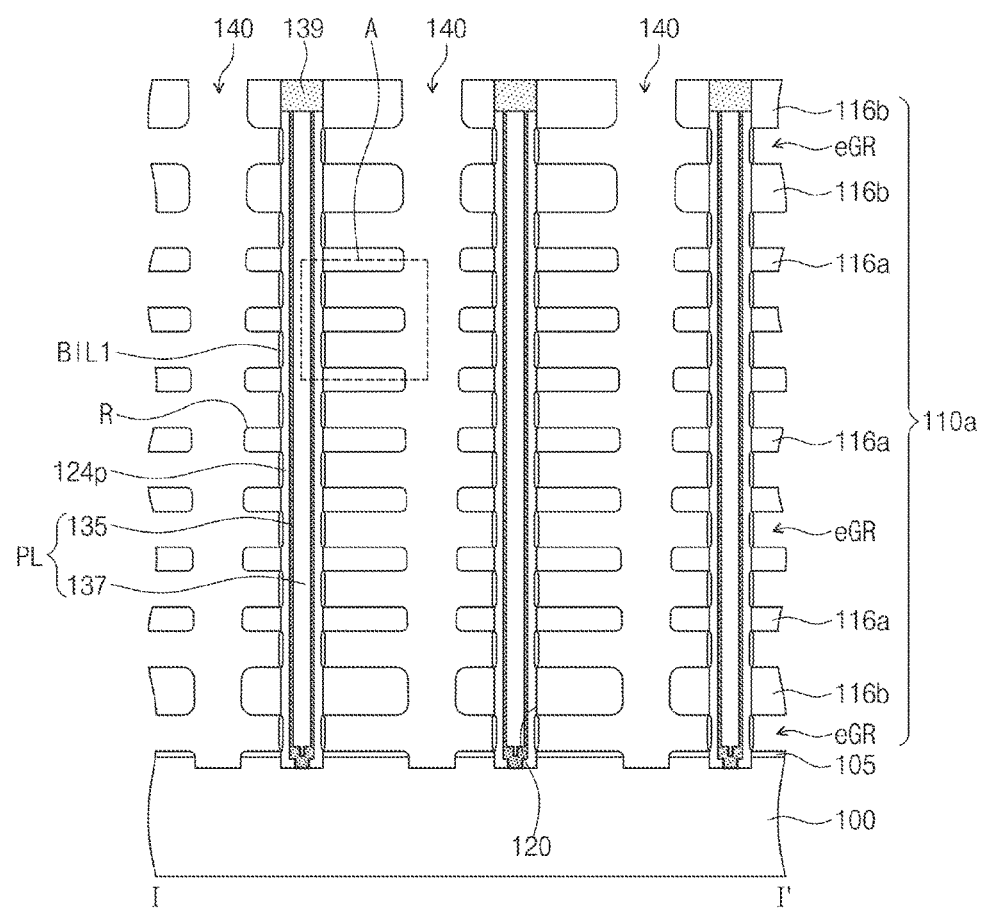
Figure 13B:
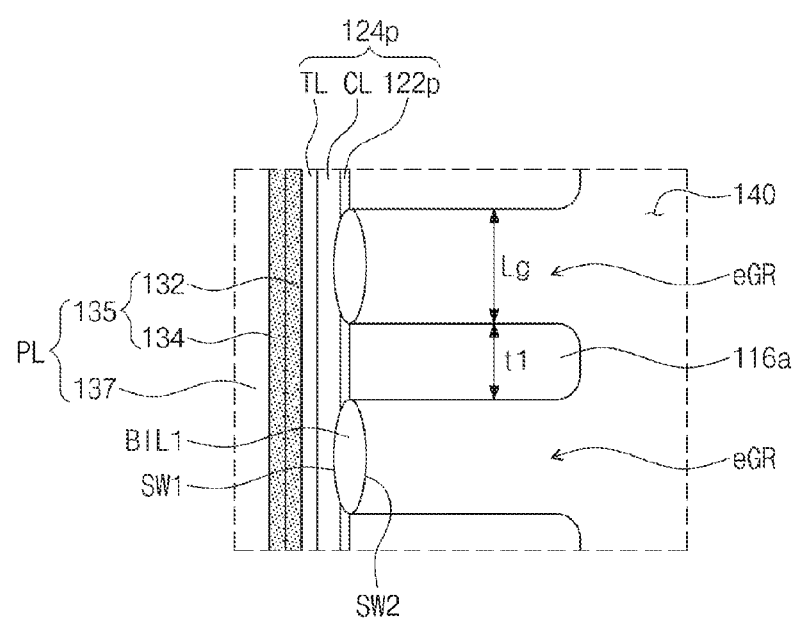

Referring to FIGS. 13A and 13B, portions of the charge storage layer CL exposed through the enlarged gate regions eGR may be oxidized to form first blocking insulating layers BIL1. The first blocking insulating layers BIL1 may be formed to have island shapes spaced apart from each other. The oxidation of the charge storage layer CL may be performed by a radical oxidation process using a mixture gas of hydrogen ($H_2$) and oxygen ($O_2$). Oxygen radicals formed during the oxidation process may chemically react with silicon included in the charge storage layer CL to form the first blocking insulating layers BIL1. For example, the first blocking insulating layers BIL1 may include a silicon oxide layer.

Each of the first blocking insulating layers BIL1 may have a first sidewall SW1 and a second sidewall SW2 opposite to each other when viewed from a cross-sectional view. Shapes of the first and second sidewalls SW1 and SW2 may be variously changed according to a degree of the oxidation of the charge storage layer CL. For example, the first sidewall SW1 may be convex toward the charge storage layer CL. The second sidewall SW2 may be convex toward the isolation trench 140 or may be concave toward the charge storage layer CL.

Even though not shown in the drawings, an upper portion of the substrate 100 exposed through the isolation trench 140 may be partially oxidized by the oxidation process. The oxide layer formed on the substrate 100 may be removed by a subsequent process (e.g., a cleaning process).

Generally, a first blocking insulating layer may be formed when the vertical insulating layer 124 is formed (e.g., the protection insulating layer 122 formed in the processes of FIGS. 8A and 8B may act as the first blocking insulating layer, and the first blocking insulating layer BIL1 formed by the oxidation process may be omitted.). In this case, the first blocking insulating layer (e.g., the protection insulating layer 122) may be etched-damaged in a process of replacing the sacrificial layers 112 with gate electrodes EL (e.g., a process of formation of the gate regions GR). However, according to some example embodiments of inventive concepts, the first blocking insulating layer BIL1 may be formed after the formation of the enlarged gate regions eGR, and thus it is possible to limit and/or prevent the etch damage of the first blocking insulating layer BIL1 which may occur in the process of replacing the sacrificial layers 112 with gate electrodes EL.

Figure 14A:
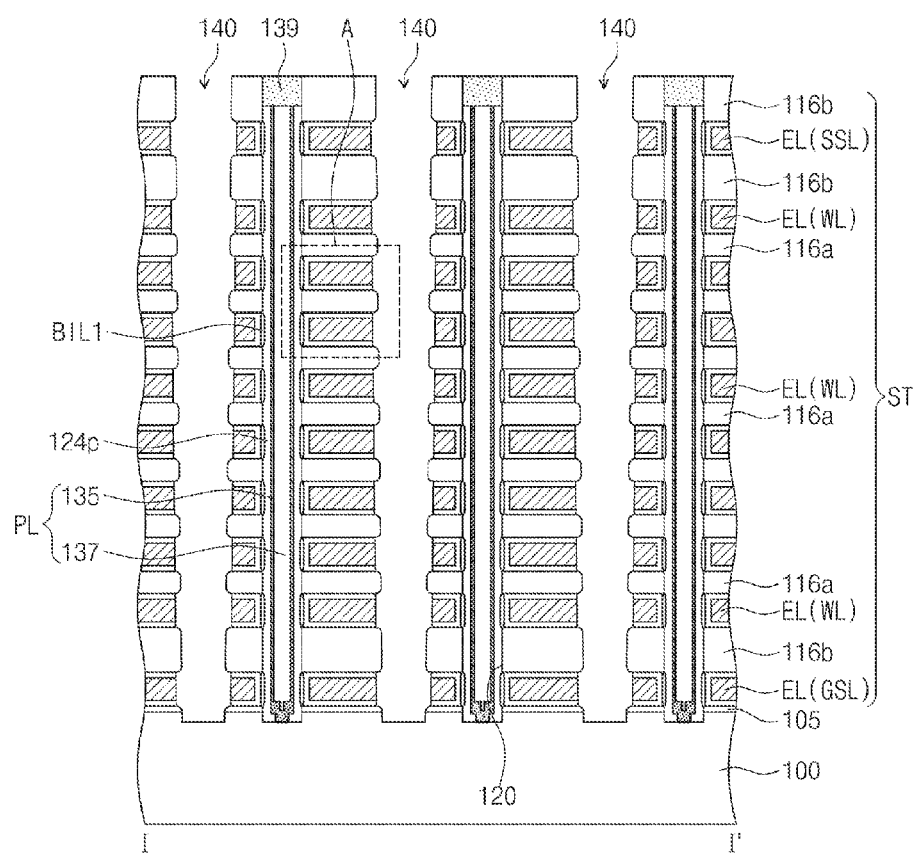
Figure 14B:
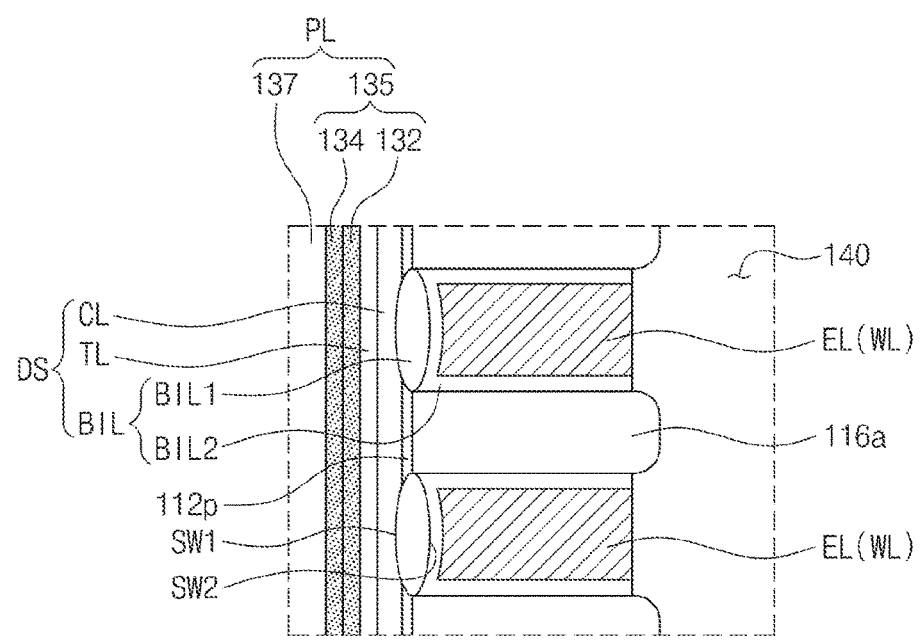

Referring to FIGS. 14A and 14B, a second blocking insulating layer BIL2 may be formed on inner surfaces of the enlarged gate regions eGR. For example, the second blocking insulating layer BIL2 may be formed to conformally cover top and bottom surfaces of the insulating patterns 116a and 116b and the second sidewalls of the first blocking insulating layers BIL1, which are exposed through the enlarged gate regions eGR.

The second blocking insulating layer BIL2 may be formed of a material of which a dielectric constant is higher than that of a silicon oxide layer. For example, the second blocking insulating layer BIL2 may include an aluminum oxide layer and/or a hafnium oxide layer. The second blocking insulating layer BIL2 may be formed by an ALD method. The first blocking insulating layer BIL1 and the second blocking insulating layer BIL2 may be defined as a blocking insulating layer BIL. In addition, the blocking insulating layer BIL, the charge storage layer CL, and the tunnel insulating layer TL may be defined as a data storage layer DS.

Next, a conductive layer may be formed in the enlarged gate regions eGR through the isolation trenches 140. The conductive layer may be formed of at least one of a poly-silicon layer, a metal layer (e.g., a tungsten (W) layer), or a metal nitride layer (e.g., a titanium nitride (TiN) layer, a tantalum nitride (TaN) layer, or a tungsten nitride (WN) layer). For example, the conductive layer may include the metal nitride layer and the metal layer on the metal nitride layer. The conductive layer may be formed by an ALD method. Subsequently, portions of the conductive layer formed in the isolation trenches 140 may be removed to locally form gate electrodes EL in the enlarged gate regions eGR, respectively. In some example embodiments, as illustrated in FIG. 14B, the gate electrodes EL may be formed in such a way that a horizontal distance from the data storage layer DS to an outer sidewall of each of the gate electrodes EL is smaller than a horizontal distance from the data storage layer DS to an outer sidewall of each of the insulating patterns 116a and 116b. In other words, the outer sidewalls of the gate electrodes EL may be laterally recessed from the outer sidewalls of the insulating patterns 116a and 116b toward the data storage layer DS.

Since the gate electrodes EL are formed in the enlarged gate regions eGR as described above, stack structures ST may be formed on the substrate 100. Each of the stack structures ST may include the gate electrodes EL and the insulating patterns 116a and 116b, which are alternately and repeatedly stacked on the substrate 100. The stack structures ST may extend in the first direction D1 and may be spaced apart from each other in the second direction D2, as illustrated in FIG. 3. The substrate 100 may be exposed between the stack structures ST adjacent to each other.

Referring again to FIGS. 4 and 5A, common source regions CSR may be formed in the substrate 100 between the stack structures ST. The common source regions CSR may extend in parallel in the first direction D1 and may be spaced apart from each other in the second direction D2. The common source regions CSR may be formed by doping the substrate 100 with dopants having a different conductivity type from the substrate 100.

Next, insulating spacers SP may be formed to cover sidewalls of the isolation trenches 140. Forming the insulating spacers SP may include depositing a spacer layer with a uniform thickness on the substrate 100 having the stack structures ST, and performing an etch-back process on the spacer layer to expose the common source region CSR. Here, the spacer layer may be formed of an insulating material, and a thickness of the spacer layer deposited on the sidewalls of the isolation trenches 140 may be equal to or smaller than about a half of the minimum width of the isolation trench 140. For example, the spacer layer may include at least one of a silicon oxide layer, a silicon nitride layer, a silicon oxynitride layer, or a low-k dielectric layer having a low dielectric constant.

Common source plugs CSP may be formed in the isolation trenches 140 in which the insulating spacers SP are formed. In some example embodiments, the common source plug CSP may be disposed between the gate electrodes EL horizontally adjacent to each other and may extend in parallel to the gate electrodes EL. However, example embodiments of inventive concepts are not limited thereto.

A capping insulating layer 145 may be formed on the stack structures ST and may cover top surfaces of the common source plugs CSP. Next, bit line contact plugs BPLG may be formed to penetrate the capping insulating layer 145. The bit line contact plugs BPLG may be connected to the vertical pillars PL, respectively. Subsequently, bit lines BL may be formed on the capping insulating layer 145. The bit lines BL may extend in the second direction D2 and may be connected to the bit line contact plugs BPLG (see FIG. 3). Thus, the semiconductor device of FIGS. 4 and 5A may be completed.

As described above, thin layers having the etch selectivity with respect to each other may be alternately and repeatedly stacked to form the thin-layer structure 110. Thus, striations may be generated at inner sidewalls of the vertical holes 120 by a difference between reaction of an etching gas and the sacrificial layers/the insulating layers and reaction of the etching gas and byproducts. A degree of generation of the striation may be varied according to a height of the vertical holes 120. For example, the degree of the striation generated at the inner sidewall at a height of a middle portion of the thin-layer structure 110 may be more than the degree of the striation generated at the inner sidewall at a height of an upper portion or a lower portion of the thin-layer structure 110. In addition, as illustrated in FIG. 15, the degree of generation of the striation may increase as a ratio of the thickness of the sacrificial layer to the thickness of the insulating layer increases. The graph of FIG. 15 illustrates the degree of generation of the striation according to the thickness ratio of the sacrificial layer to the insulating layer (e.g., a thickness ratio (t3/t2) of the sacrificial layer 112 to the first insulating layer 114a) at the height of the middle portion of the thin-layer structure 110. Here, the increase in a value Y of the degree of generation of the striation may mean that the generation of the striation becomes worse. In addition, the value Y of the degree of generation of the striation, which is zero (0), may mean that diameters of the vertical holes are completely uniform.

Generally, thicknesses of sacrificial layers corresponding to thicknesses of word lines may be greater than thicknesses of insulating layers disposed between the word lines. In this case, striations generated at the inner sidewalls of the vertical holes 120 at the height of the middle portion of the thin-layer structure 110 may become worse, as illustrated in FIG. 17. The striations may mean non-uniformity of diameters of vertical holes, and this non-uniformity may cause non-uniformity of diameters of vertical pillars formed through subsequent processes. This may worsen dispersion of characteristics of memory cells, and thus reliability of a semiconductor device may be deteriorated. However, according to some example embodiments of inventive concepts, the sacrificial layers 112 may be formed to be thinner than the insulating layers (e.g., the first insulating layers 114a), and thus the generation of the striations described above may be inhibited. As a result, the vertical holes 120 may be formed to have substantially uniform diameters at the height of the middle portion of the thin-layer structure 110, as illustrated in FIG. 16.

Meanwhile, the reduction in the thicknesses of the sacrificial layers 112 may cause reduction in the thicknesses of the word lines WL, and thus resistances of the word lines WL may increase. However, according to some example embodiments of inventive concepts, to avoid an increase in resistance of the word lines WL, the process of enlarging the vertical heights of the gate regions GR formed by removing the sacrificial layers 112 (e.g., the process of forming the enlarged gate regions eGR) may be performed in the process of replacing the sacrificial layers 112 with the gate electrodes EL. As a result, sufficient thicknesses of the word lines WL may be secured. On the other hand, when a distance between the word lines WL is reduced by the reduction in the thicknesses of the first insulating patterns 116a, the first insulating pattern 116a may be broken down by a word line voltage applied between the word lines WL. To reduce and/or prevent a breakdown of the first insulating pattern 116a, the thicknesses of the sacrificial layers 112 and the thicknesses of the insulating layers (e.g., the first insulating layers 114a) may be suitably adjusted.

According to some example embodiments of inventive concepts, the ratio (t3/t2) of the thickness of the sacrificial layer 112 to the thickness of the first insulating layer 114a may range from 0.55 to 0.95. This may be a value calculated to reduce and/or inhibit the generation of the striation as much as possible and to secure desired electrical characteristics of the memory cell. As illustrated in FIG. 15, the degree of generation of the striation according to the thickness ratio (t3/t2) of the sacrificial layer to the insulating layer may be expressed by the following equation 1.

$$Y=aX+b \qquad \text{[Equation 1]}$$

Here, "Y" denotes the degree of generation of the striation, and "X" denotes the thickness ratio of the sacrificial layer to the insulating layer. In addition, "a" denotes a rational number of 0.2806, and "b" denotes a rational number of 0.7323.

It may be recognized that "X (=t3/t2)" may be equal to or less than about 0.95 to obtain a desired degree Y of generation of the striation (e.g., "Y" is 1 or less) when calculated through FIG. 15 and the equation 1. In addition, "X (=t3/t2)" may have the minimum value of 0.55 in consideration of the thickness of the word line WL and the thickness of the first insulating pattern 116a capable of withstanding breakdown.

As a result, according to some example embodiments of inventive concepts, the characteristics of the memory cells may be improved to provide the semiconductor device with improved reliability.

Figure 18:
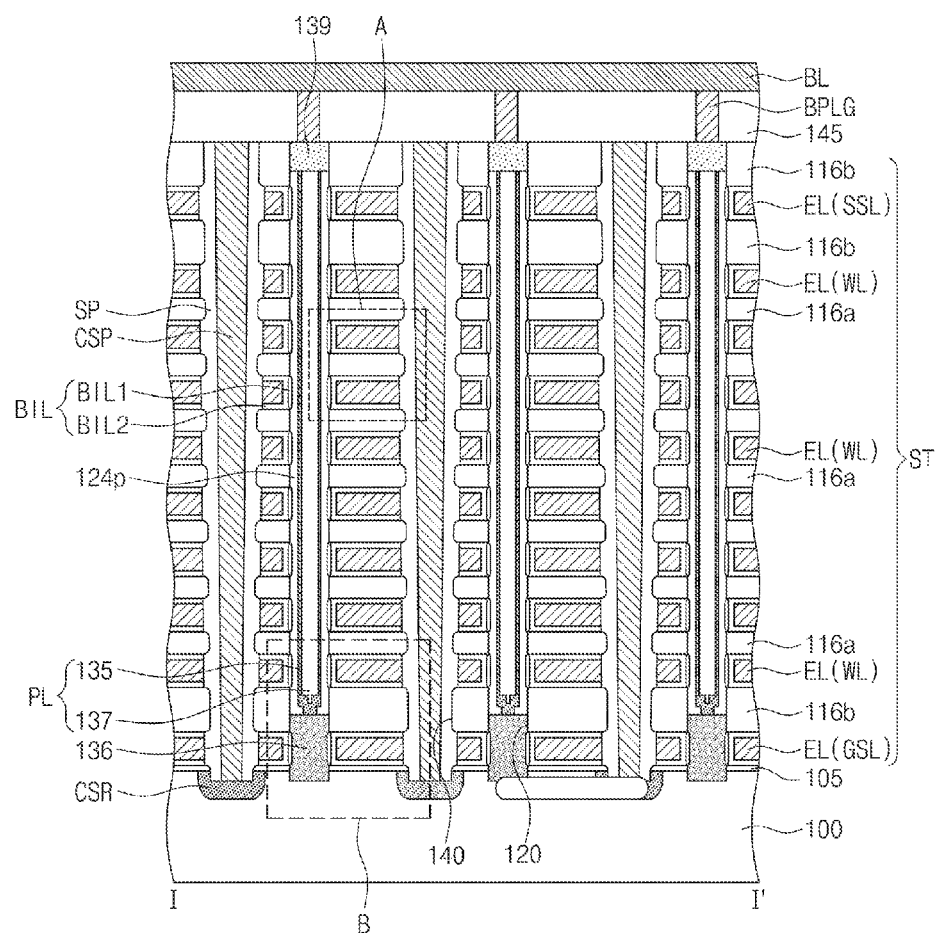
FIG. 18 is a cross-sectional view taken along the line I-I' of FIG. 3 to illustrate a semiconductor device according to some example embodiments of inventive concepts.
Figure 19A:
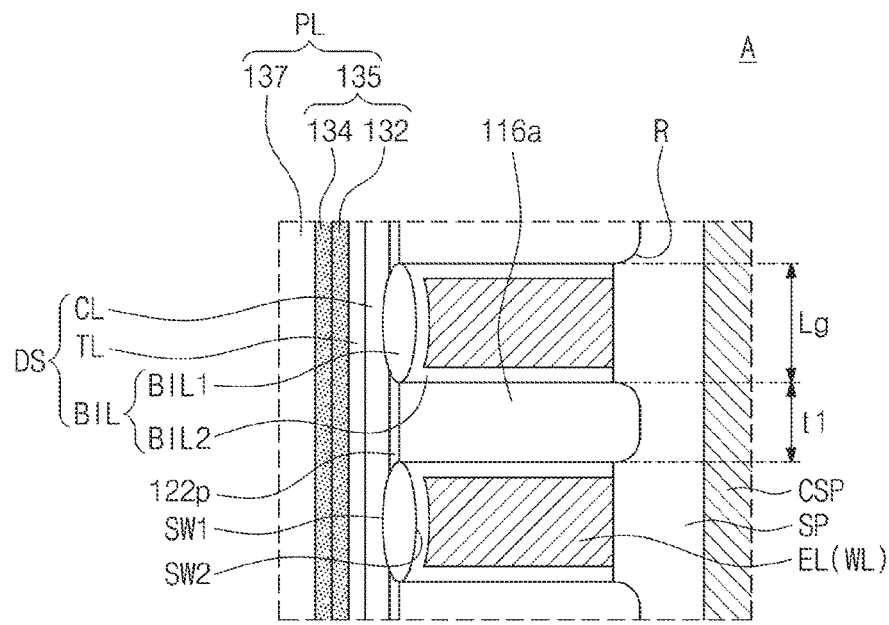
FIGS. 19A and 19B are enlarged views corresponding to a portion 'A' and a portion 'B' of FIG. 18, respectively.
Figure 19B:
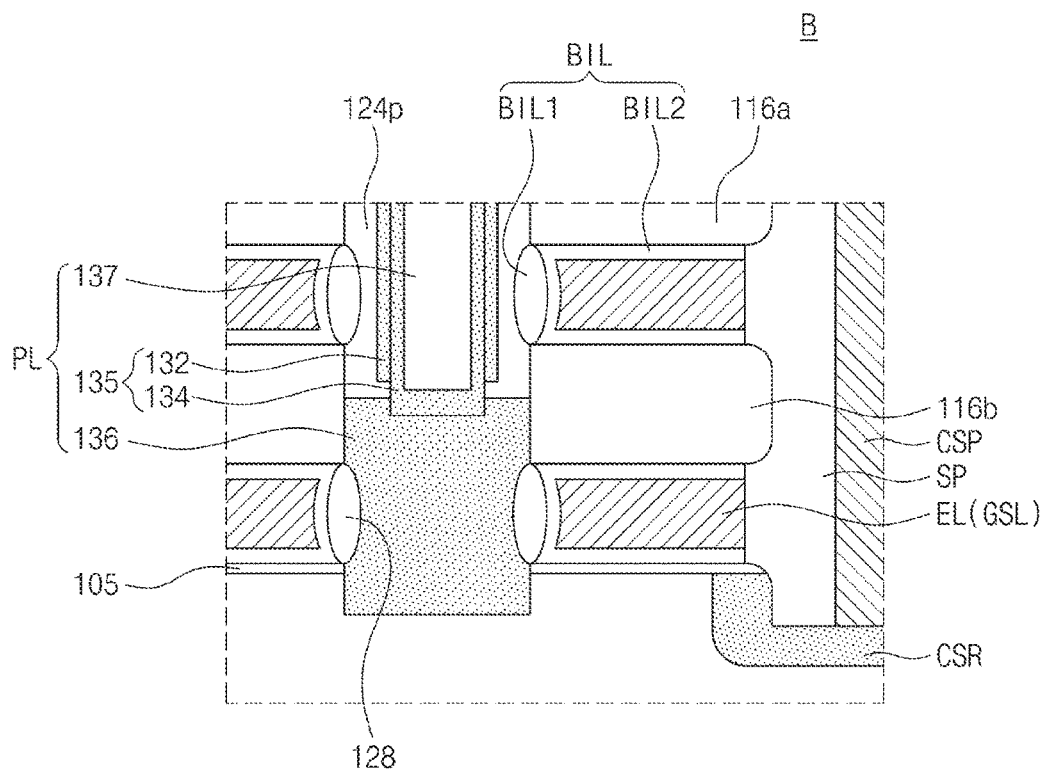

FIG. 18 is a cross-sectional view taken along the line I-I' of FIG. 3 to illustrate a semiconductor device according to some example embodiments of inventive concepts. FIGS. 19A and 19B are enlarged views corresponding to a portion 'A' and a portion 'B' of FIG. 18, respectively. The same elements as in the embodiment of FIGS. 4 and 5A will be indicated by the same reference numerals or the same reference designators, and the descriptions thereto will be omitted or mentioned briefly for the purpose of ease and convenience in explanation.

Referring to FIGS. 3, 18, 19A, and 19B, each of vertical pillars PL may include a lower semiconductor pattern 136 penetrating a lower portion of the stack structure ST so as to be connected to the substrate 100, and an upper semiconductor pattern 135 penetrating an upper portion of the stack structure ST so as to be connected to the lower semiconductor pattern 136. A bottom surface of the lower semiconductor pattern 136 may be lower than the top surface of the substrate 100, and thus a bottom end portion of the lower semiconductor pattern 136 may be inserted in the substrate 100. A top surface of the lower semiconductor pattern 136 may be higher than a top surface of the ground selection line GSL.

The second insulating pattern 116b adjacent to the lower semiconductor pattern 136 may be in direct contact with a sidewall of the lower semiconductor pattern 136. The second blocking insulating layer BIL2 may be disposed between the ground selection line GSL and the lower semiconductor pattern 136, and a gate dielectric layer 128 may be disposed between the second blocking insulating layer BIL2 and the lower semiconductor pattern 136. For example, the gate dielectric layer 128 may include a silicon oxide layer.

The lower semiconductor pattern 136 may be formed of a semiconductor material having the same conductivity type as the substrate 100. The lower semiconductor pattern 136 may be formed by performing a selective epitaxial growth (SEG) process using the substrate 100 exposed through the vertical hole 120 as a seed in the processes of FIGS. 7A and 7B. The lower semiconductor pattern 136 may be formed to have a pillar shape filling a lower region of the vertical hole 120.

The upper semiconductor pattern 135 may have a hollow pipe or macaroni shape. A bottom end of the upper semiconductor pattern 135 may be in a closed state. An inner space of the upper semiconductor pattern 135 may be filled with a filling insulation pattern 137. A bottom surface of the upper semiconductor pattern 135 may be disposed at a lower level than a top surface of the lower semiconductor pattern 136. In other words, a portion of the top surface of the lower semiconductor pattern 136 may be recessed, and a bottom end portion of the upper semiconductor pattern 135 may be inserted in the recessed region of the top surface of the lower semiconductor pattern 136. The upper semiconductor pattern 135 may be formed of a semiconductor material. The upper semiconductor pattern 135 may include first and second semiconductor patterns 132 and 134. The first and second semiconductor patterns 132 and 134 may include the same materials as the first and second semiconductor patterns 132 and 134 described with reference to FIGS. 4 and 5A, respectively.

Other elements of the semiconductor device in FIG. 18 may be the same or similar as corresponding elements of the semiconductor device described with reference to FIGS. 4 and 5A. Even though the second sidewall SW2 of the first blocking insulating layer BIL1 is convex in FIGS. 19A and 19B, example embodiments are not limited thereto. For example, in other example embodiments, the second sidewall SW2 of the first blocking insulating layer BIL1 may alternatively have a concave shape towards charge storage layer CL. In other words, the second sidewall SW2 of the first blocking insulating layer BL1 may be convex towards the charge storage layer CL. Similarly, a sidewall of the gate dielectric layer 128 opposite the lower semiconductor pattern 136 may be concave towards the lower semiconductor pattern 136. FIG. 5B.

Figure 21A:
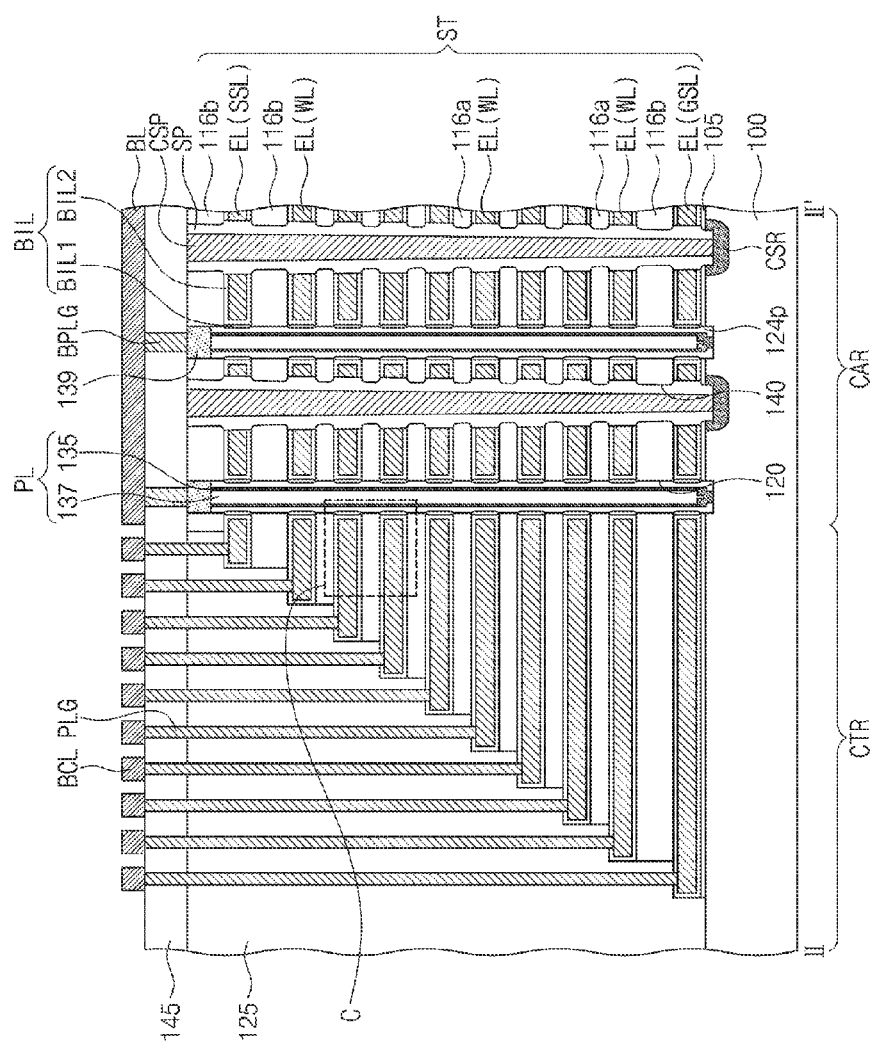
FIGS. 21A and 21C are cross-sectional views taken along lines II-II' and III-III' of FIG. 20, respectively.
Figure 21B:
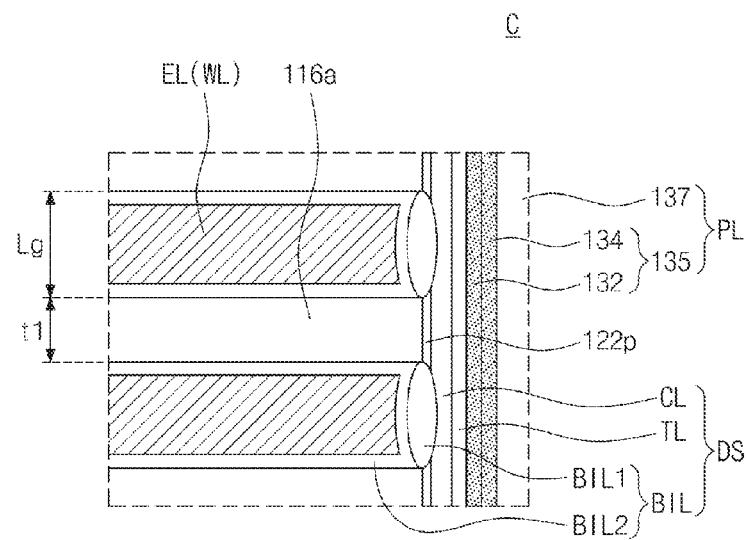
FIGS. 21B and 21D are enlarged views corresponding to a portion 'C' of FIG. 21A and a portion 'D' of FIG. 21C, respectively.
Figure 21C:
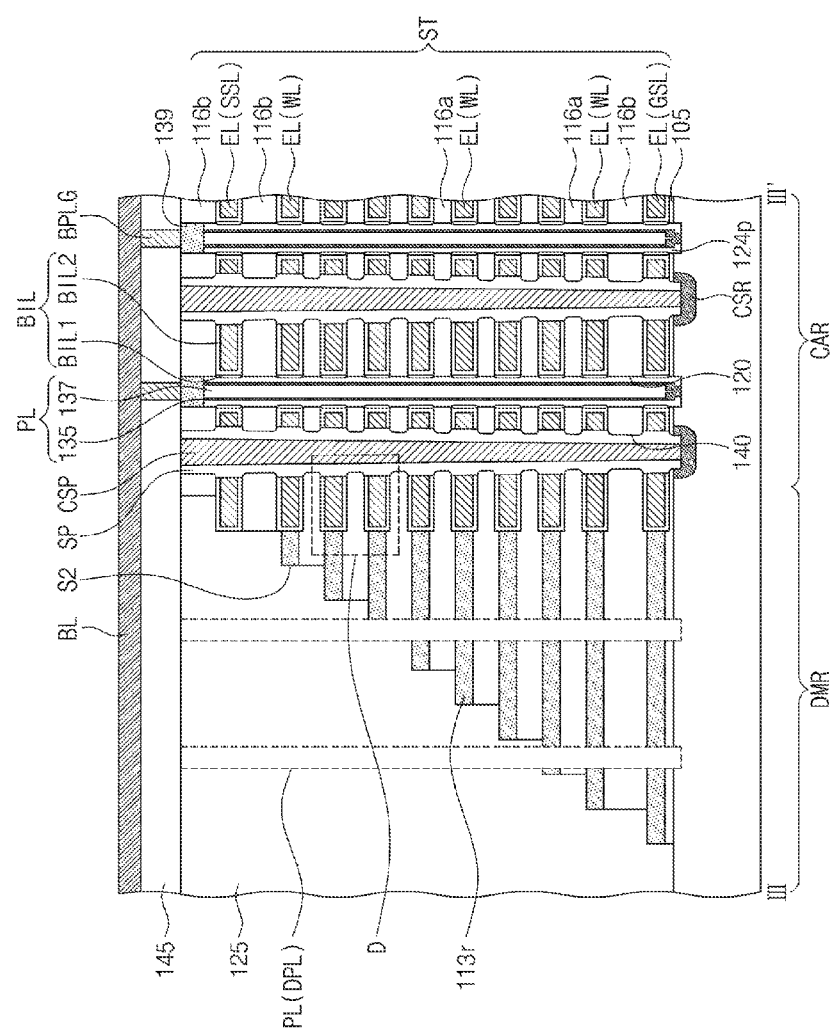
Figure 21D:
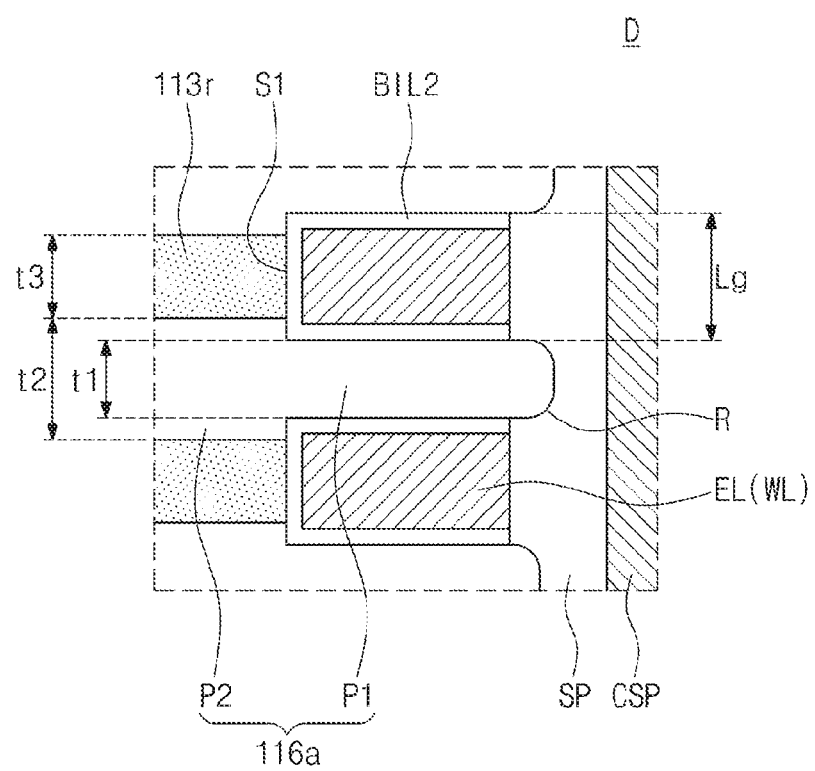

FIG. 20 is a plan view illustrating a semiconductor device according to some example embodiments of inventive concepts. FIGS. 21A and 21C are cross-sectional views taken along lines II-II' and III-III' of FIG. 20, respectively. FIGS. 21B and 21D are enlarged views corresponding to a portion 'C' of FIG. 21A and a portion 'D' of FIG. 21C, respectively. Hereinafter, the descriptions to the same elements as shown in FIGS. 4 and 5A will be omitted or mentioned briefly for the purpose of ease and convenience in explanation.

Referring to FIGS. 20 and 21A to 21D, a substrate 100 may include a cell array region CAR, contact regions CTR disposed at both sides of the cell array region CAR in a first direction D1, and dummy regions DMR disposed at both sides of the cell array region CAR in a second direction D2 perpendicular to the first direction D1.

Each of stack structures ST may include gate electrodes EL and insulating patterns 116a and 116b, which are vertically alternately stacked on the substrate 100. The gate electrodes EL may include a string selection line SSL, word lines WL, and a ground selection line GSL. As described above, the insulating patterns 116a and 116b may include first insulating patterns 116a and second insulating patterns 116b, and the second insulating patterns 116b may be thicker than the first insulating patterns 116a. Thicknesses of the first insulating patterns 116a and a distance between the first insulating patterns 116a may be the same as described with reference to FIGS. 4 and 5A.

The stack structures ST may extend from the cell array region CAR onto the contact region CTR. The stack structures ST may have stepwise structures in the first direction D1 or a direction opposite to the first direction D1 on the contact region CTR. In other words, sidewalls of the gate electrodes EL may be spaced apart from each other on the contact region CTR, and areas of the gate electrodes EL on the contact region CTR may sequentially decrease as vertical heights of the gate electrodes EL sequentially increase. The insulating patterns 116a and 116b of the contact region CTR may have sidewalls aligned with the sidewalls of the gate electrodes EL, respectively.

The stack structure ST may include residual sacrificial patterns 113r on the dummy region DMR. The residual sacrificial patterns 113r may be portions of sacrificial layers 112 remaining in a process of replacing the sacrificial layers 112 with the gate electrodes EL. Each of the residual sacrificial patterns 113r may be disposed between the insulating patterns 116a and 116b vertically adjacent to each other on the dummy region DMR and may be disposed horizontally at a side of each of the gate electrodes EL on the dummy region DMR. The stack structures ST may have stepwise structures in the second direction D2 or a direction opposite to the second direction D2 on the dummy region DMR. In other words, sidewalls of the residual sacrificial patterns 113r may be spaced apart from each other on the dummy region DMR, and areas of the residual sacrificial patterns 113r on the dummy region DMR may sequentially decrease as vertical heights of the residual sacrificial patterns 113r sequentially increase. The insulating patterns 116a and 116b of the dummy region DMR may have sidewalls aligned with the sidewalls of the residual sacrificial patterns 113r, respectively. The second blocking insulating layer BIL2 of the data storage layer DS may be disposed between the gate electrodes EL and the residual sacrificial patterns 113r.

The residual sacrificial patterns 113r may include a material having an etch selectivity with respect to the insulating patterns 116a and 116b. For example, each of the residual sacrificial patterns 113r may include at least one of silicon, silicon carbide, silicon oxynitride, or silicon nitride. For example, each of the insulating patterns 116a and 116b may include at least one of silicon, silicon oxide, silicon carbide, silicon oxynitride, or silicon nitride. At this time, the insulating patterns 116a and 116b may include a different material from the residual sacrificial patterns 113r. In some example embodiments, the residual sacrificial patterns 113r may include silicon nitride, and the insulating patterns 116a and 116b may include silicon oxide.

According to some example embodiments of inventive concepts, each of the insulating patterns 116a and 116b may include portions having thicknesses different from each other on the dummy region DMR. In other words, each of the insulating patterns 116a and 116b of the dummy region DMR may include a first portion P1 disposed between the gate electrodes EL vertically adjacent to each other and a second portion P2 disposed between the residual sacrificial patterns 113r vertically adjacent to each other. The second portion P2 may be thicker than the first portion P1. For example, the first portion P1 of the first insulating pattern 116a of the dummy region DMR may have a first thickness t1, and the second portion P2 of the first insulating pattern 116a of the dummy region DMR may have a second thickness t2 greater than the first thickness t1. A third thickness t3 of the residual sacrificial pattern 113r may be smaller than the second thickness t2 of the second portion P2. According to some example embodiments of inventive concepts, a ratio (t3/t2) of the thickness of the residual sacrificial pattern 113r to the thickness of the second portion P2 of the first insulating pattern 116a may range from 0.55 to 0.95. In addition, the third thickness t3 of the residual sacrificial pattern 113r may be smaller than a distance Lg between the first portions P1 vertically adjacent to each other.

In some example embodiments, vertical pillars PL may penetrate the stack structures ST disposed on the cell array region CAR and the dummy region DMR and may be connected to the substrate 100. The vertical pillars PL may include a semiconductor material or a conductive material. The vertical pillars PL penetrating each of the stack structures ST may be arranged in a zigzag form in one direction when viewed from a plan view. Alternatively, the vertical pillars PL penetrating each of the stack structures ST may be arranged in a line in one direction when viewed from a plan view.

Each of the vertical pillars PL of the cell array region CAR may be electrically connected to a bit line BL through a bit line contact plug BPLG. On the contrary, the vertical pillars PL of the dummy region DMR may not be connected to the bit line BL. In other words, the vertical pillars PL of the dummy region DMR may be dummy vertical pillars DPL. In some example embodiments, the vertical pillars PL of the cell array region CAR and the dummy vertical pillars DPL may have the same structure as the vertical pillars PL described with reference to FIGS. 4 and 5A. For example, each of the vertical pillars PL and the dummy vertical pillars DPL may include the semiconductor pattern 135 and the filling insulation pattern 137 filling the inner space of the semiconductor pattern 135. In some example embodiments, the vertical pillars PL of the cell array region CAR and the dummy vertical pillars DPL may have the same structure as the vertical pillars PL described with reference to FIGS. 17, 18A, and 18B. For example, each of the vertical pillars PL and the dummy vertical pillars DPL may include the lower semiconductor pattern 136, the upper semiconductor pattern 135, and the filling insulation pattern 137 disposed in the inner space of the upper semiconductor pattern 135. Even though not shown in the drawings, the dummy vertical pillars DPL may also be provided on the contact region CTR.

A data storage layer DS may be disposed between the stack structure ST and the vertical pillar PL on the cell array region CAR. The data storage layer DS may be the same as described with reference to FIGS. 4 and 5A, and thus the descriptions thereto will be omitted. In some example embodiments, the data storage layer DS of FIG. 5B may be applied to the present embodiment. The vertical insulating pattern 124p of FIGS. 9A and 9B may be disposed between the stack structure ST and the dummy vertical pillar DPL penetrating the residual sacrificial patterns 113r on the dummy region DMR, and the data storage layer DS may be disposed between the stack structure ST and the dummy vertical pillar DPL penetrating the gate electrodes EL on the dummy region DMR.

An isolation trench 140 extending in the first direction D1 may be provided between the stack structures ST adjacent to each other, and an insulating spacer SP and a common source plug CSP may be disposed in the isolation trench 140. The insulating spacer SP and the common source plug CSP may extend in the first direction D1. A common source region CSR may be disposed in the substrate 100 under the common source plug CSP.

An upper filling insulation layer 125 may be disposed on the substrate 100 and may cover the stack structures ST. The upper filling insulation layer 125 may have a planarized top surface and may cover end portions of the stack structures ST. The upper filling insulation layer 125 may include one insulating layer or a plurality of stacked insulating layers. A capping insulating layer 145 may be disposed on the upper filling insulation layer 125 and may cover the vertical pillars PL and the common source plugs CSP. Although not shown in FIGS. 21A and 21C, in some example embodiments, the upper filling insulation layer 125 may cover the vertical pillars PL and the common source plugs CSP as well as the end portions of the stack structures ST.

An interconnection structure for connecting vertically stacked gate electrodes EL to peripheral logic circuits (e.g., a decoder) may be disposed on the contact region CTR. The interconnection structure may include contact plugs PLG penetrating the upper filling insulation layer 125 and the capping insulating layer 145 so as to be connected to end portions of the gate electrodes EL, and connection lines BCL disposed on the capping insulating layer 145 so as to be connected to the contact plugs PLG. Vertical lengths of the contact plugs PLG may sequentially decrease as a horizontal distance from the cell array region CAR decreases. Top surfaces of the contact plugs PLG may be substantially coplanar with each other.

Figure 22B:
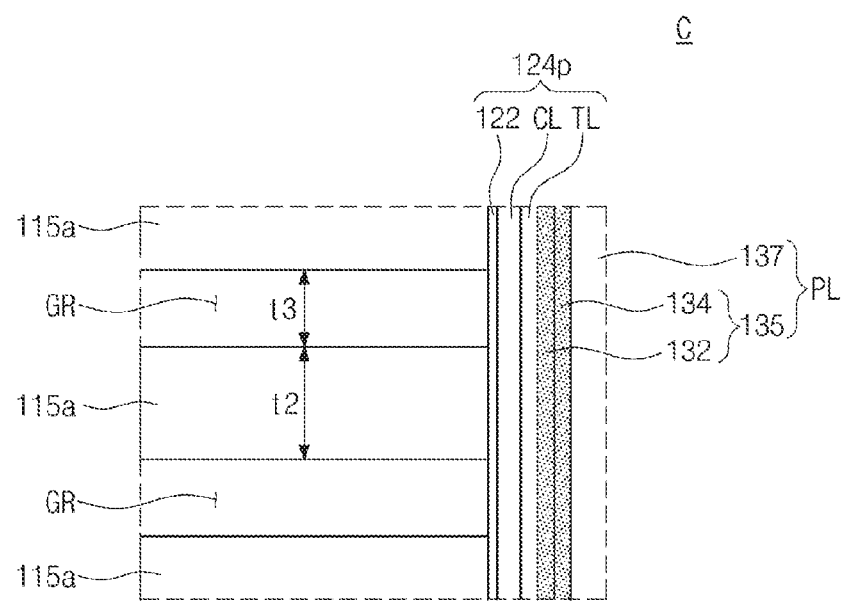
FIGS. 22B and 23B are enlarged views corresponding to portions 'C' of FIGS. 22A and 23A, respectively.
Figure 22C:
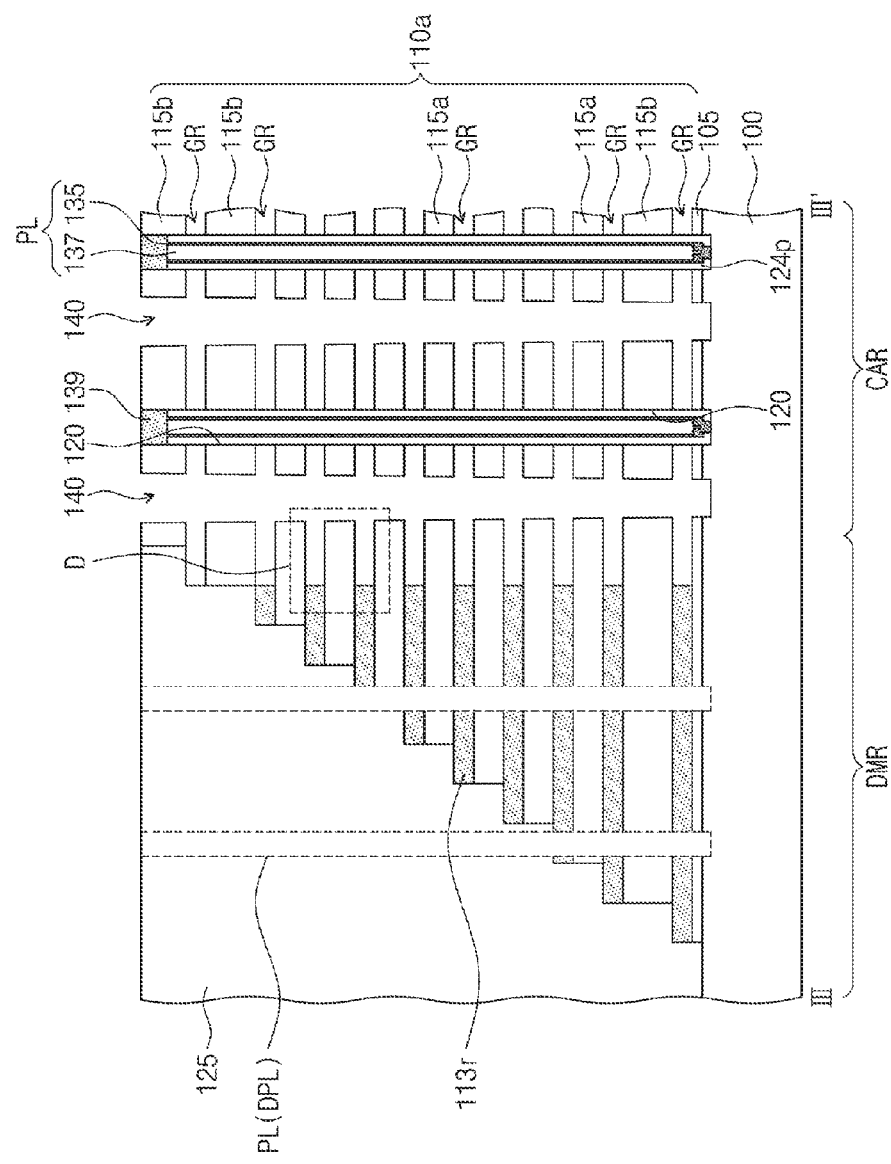
FIGS. 22C and 23C are cross-sectional views corresponding to the line III-III' of FIG. 20 to illustrate a method for fabricating a semiconductor device, according to some example embodiments of inventive concepts.
Figure 22D:
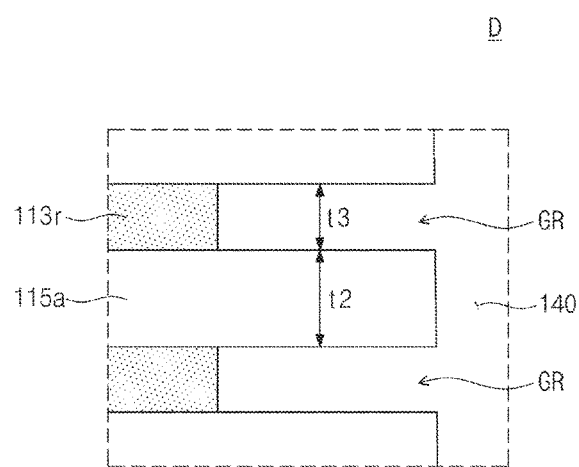
FIGS. 22D and 23D are enlarged views corresponding to portions 'D' of FIGS. 22C and 23C, respectively.
Figure 23A:
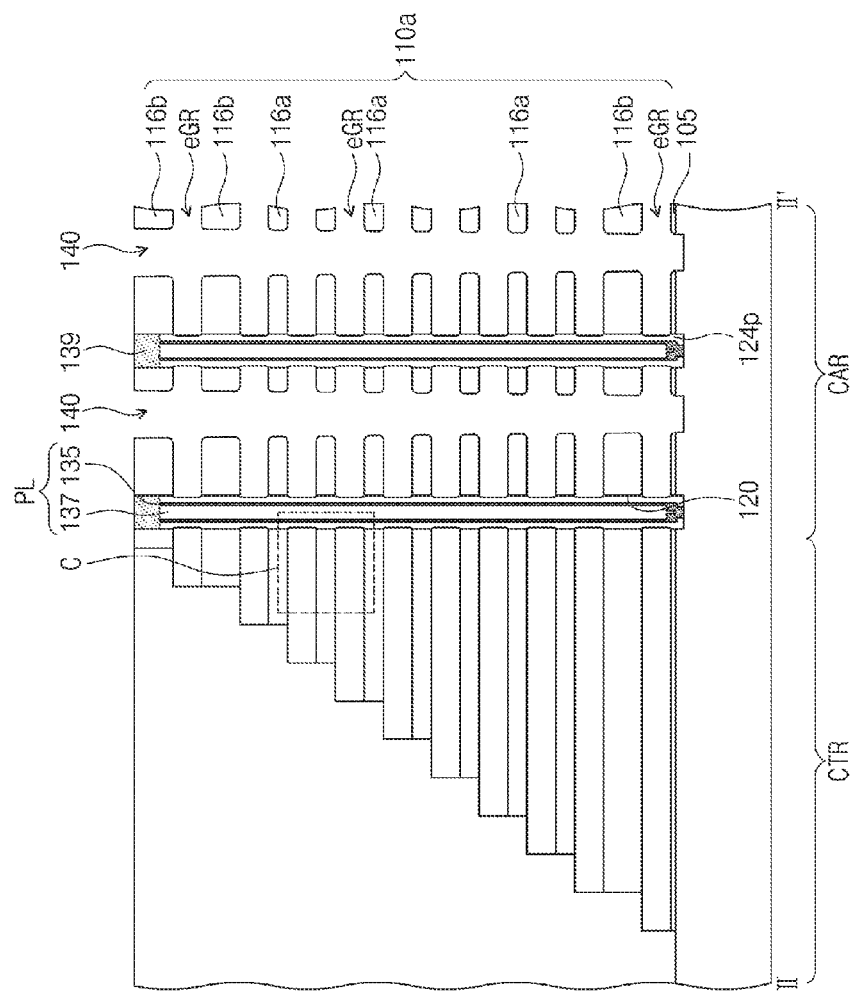
Figure 23B:
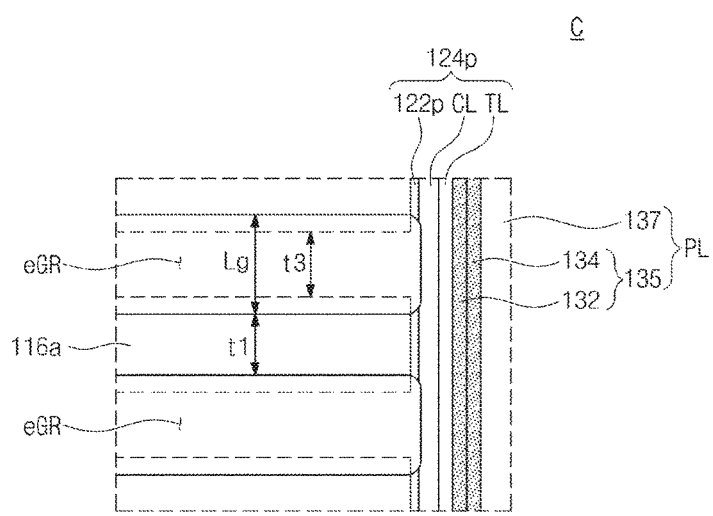
Figure 23C:
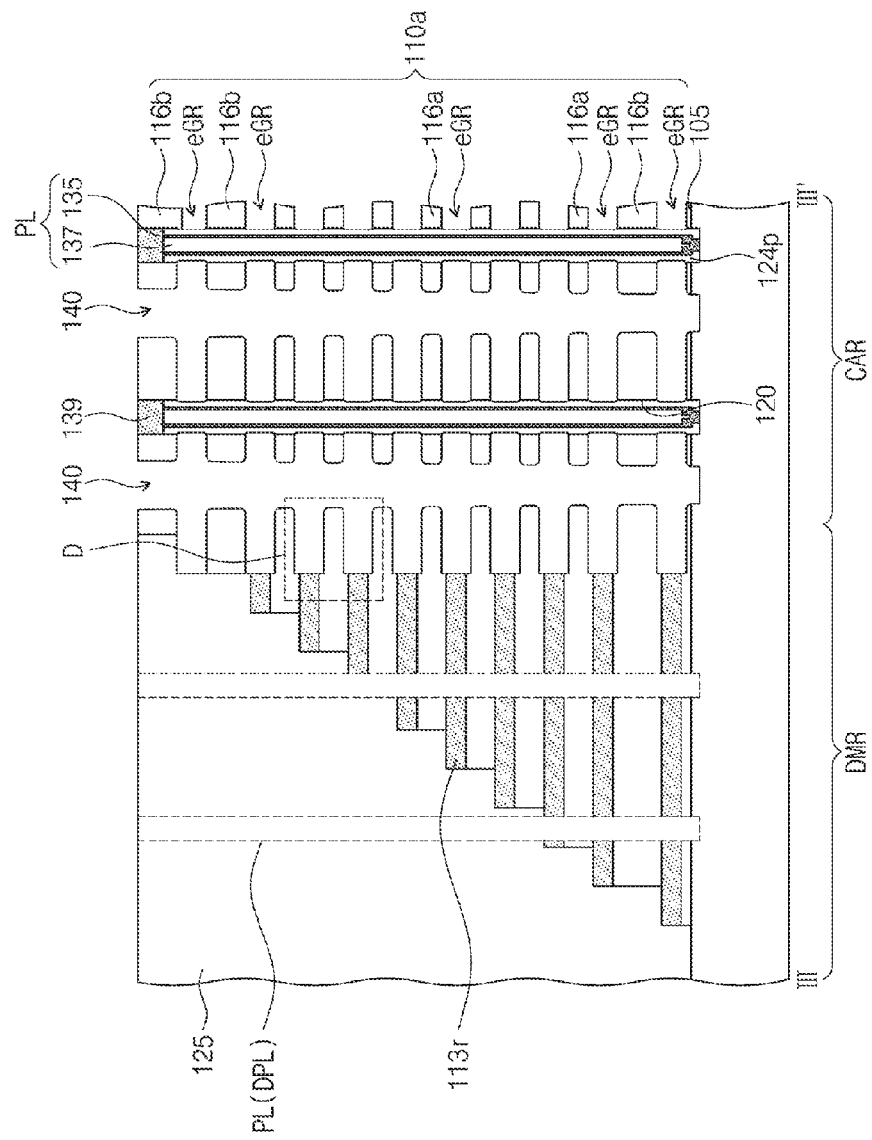
Figure 23D:
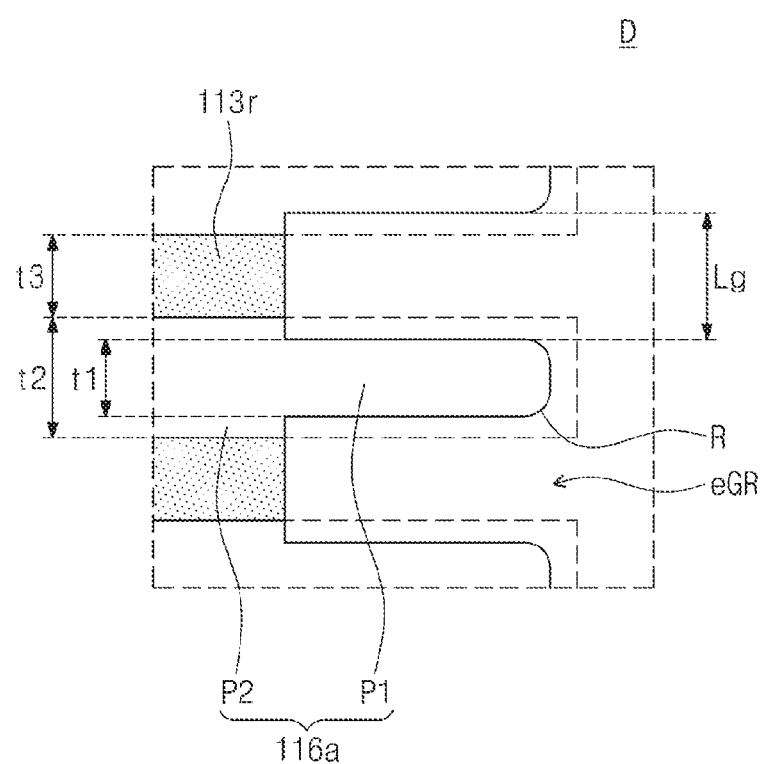

FIGS. 22A and 23A are cross-sectional views corresponding to the line II-IF of FIG. 20 to illustrate a method for fabricating a semiconductor device, according to some example embodiments of inventive concepts, and FIGS. 22C and 23C are cross-sectional views corresponding to the line III-III' of FIG. 20 to illustrate a method for fabricating a semiconductor device, according to some example embodiments of inventive concepts. FIGS. 22B and 23B are enlarged views corresponding to portions 'C' of FIGS. 22A and 23A, respectively, and FIGS. 22D and 23D are enlarged views corresponding to portions 'D' of FIGS. 22C and 23C, respectively. Fabricating processes of FIGS. 22A and 22C may correspond to the fabricating processes of FIG. 11A, and fabricating processes of FIGS. 23A and 23C may correspond to the fabricating processes of FIG. 12A. Hereinafter, the same descriptions as explained above will be omitted or mentioned briefly for the purpose of ease and convenience in explanation.

Referring to FIGS. 22A to 22D, preliminary stack structures 110a may be formed on a substrate 100 including a cell array region CAR, a contact region CTR, and a dummy region DMR. The preliminary stack structures 110a may have stepwise structures on the contact region CTR and the dummy region DMR. The preliminary stack structures 110a may be formed by the same or similar method as described with reference to FIGS. 7A to 10A and 7B to 10B.

The sacrificial patterns 113 of FIGS. 10A and 10B exposed by the isolation trench 140 may be removed to form gate regions GR between preliminary insulating patterns 115a and 115b. Forming the gate regions GR may include performing a first isotropic etching process using an etching solution including, for example, phosphoric acid. The first isotropic etching process may be performed until the sacrificial patterns 113 of the cell array region CAR are completely removed.

In some example embodiments, the sacrificial patterns 113 of the contact region CTR may be completely removed. In other words, as illustrated in FIGS. 22A and 22B, the gate regions GR of the contact region CTR may expose the upper filling insulation layer 125. On the other hand, as illustrated in FIGS. 22C and 22D, the sacrificial patterns 113 of the dummy region DMR may not be completely removed but may partially remain. Since a width in the second direction D2 of the stack structure ST on the dummy region DMR is greater than those of the stack ST on the cell array and contact regions CAR and CTR, portions of the sacrificial patterns 113 of the dummy region DMR may remain even though the sacrificial patterns 113 of the cell array region CAR are completely removed. The remaining sacrificial patterns 113 of the dummy region DMR may be referred to as 'residual sacrificial patterns 113r'. In other words, the gate regions GR of the dummy region DMR may expose the residual sacrificial patterns 113r. As a result, portions of the preliminary insulating patterns 115a and 115b overlapping with the residual sacrificial patterns 113r may not be exposed by the gate regions GR. First preliminary insulating patterns 115a may have the second thickness t2, and the residual sacrificial patterns 113r may have the third thickness t3. A ratio (t3/t2) of the third thickness t3 to the second thickness t2 may range from 0.55 to 0.95.

Referring to FIGS. 23A to 23D, portions of the protection insulating layer 122 and the preliminary insulating patterns 115a and 115b exposed by the gate regions GR may be removed to form enlarged gate regions eGR. Forming the enlarged gate regions GR may include performing a second isotropic etching process using an etching solution including, for example, hydrofluoric acid (HF). Insulating patterns 116a and 116b may be formed from the preliminary insulating patterns 115a and 115b by the second isotropic etching process, and the protection insulating layer 122 may be vertically divided into protection insulating patterns 122p by the second isotropic etching process. Vertical thicknesses and horizontal thicknesses (or widths) of the insulating patterns 116a and 116b may be smaller than vertical thicknesses and horizontal thicknesses (or widths) of the preliminary insulating patterns 115a and 115b. The portions of the preliminary insulating patterns 115a and 115b overlapping with the residual sacrificial patterns 113r on the dummy region DMR may not be removed during the second isotropic etching process, and thus each of the insulating patterns 116a and 116b of the dummy region DMR may include a first portion P1 and a second portion P2 which have thicknesses different from each other. As shown in FIG. 21D, the residual sacrificial patterns 113r may include first sidewalls S1. The second blocking insulating layer BIL2, which may include a high-dielectric layer, may be between the first sidewalls S1 and the gate electrodes EL (word lines WL) that are adjacent to the first sidewalls S1. As shown in FIG. 21C, the residual sacrificial patterns 113r may include second sidewalls S2 opposite the first sidewalls S1. The second sidewalls S2 may be laterally spaced apart from each other in a plan view (see FIG. 20) and define a stepwise structure.

Thereafter, the same or similar processes as described with reference to FIGS. 4, 5A, 13A, 13B, 14A, and 14B may be performed to complete the semiconductor device of FIGS. 21A to 21D.

Figure 24A:
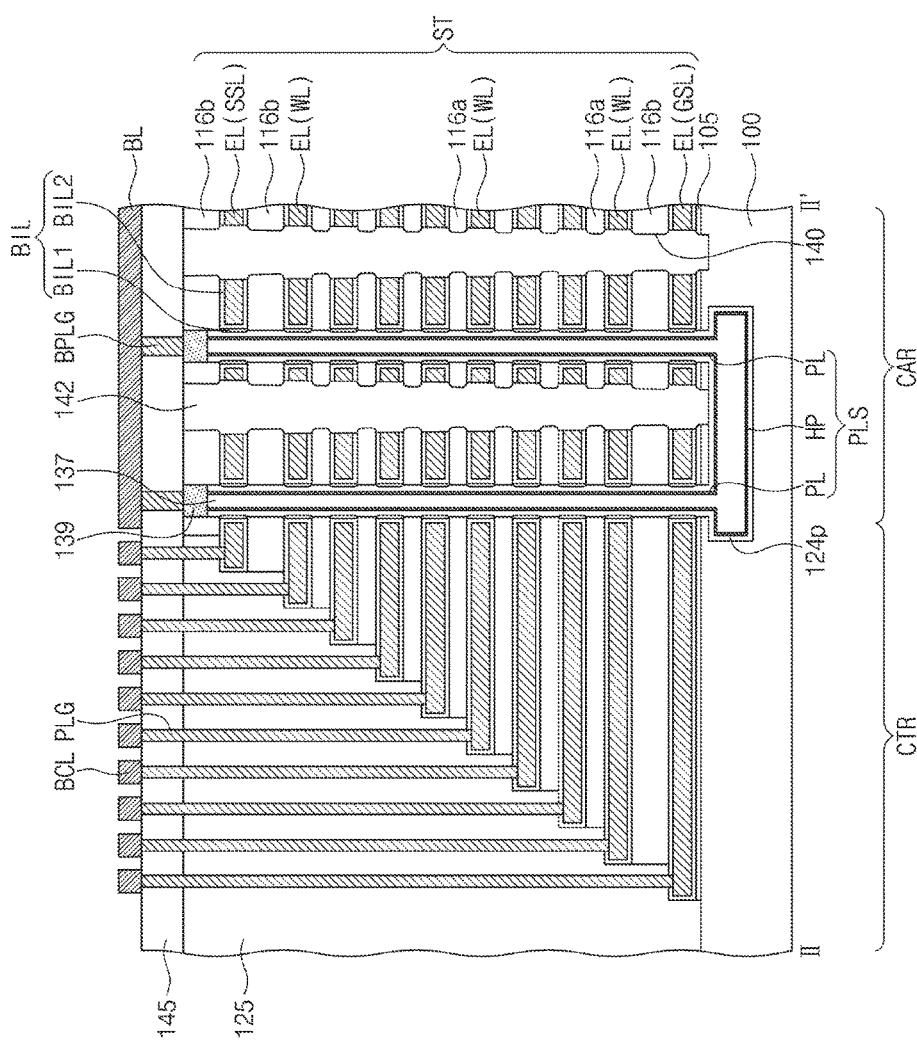
FIGS. 24A and 24B are cross-sectional views corresponding to the lines II-II' and III-III' of FIG. 20, respectively, to illustrate a semiconductor device according to some example embodiments of inventive concepts.
Figure 24B:
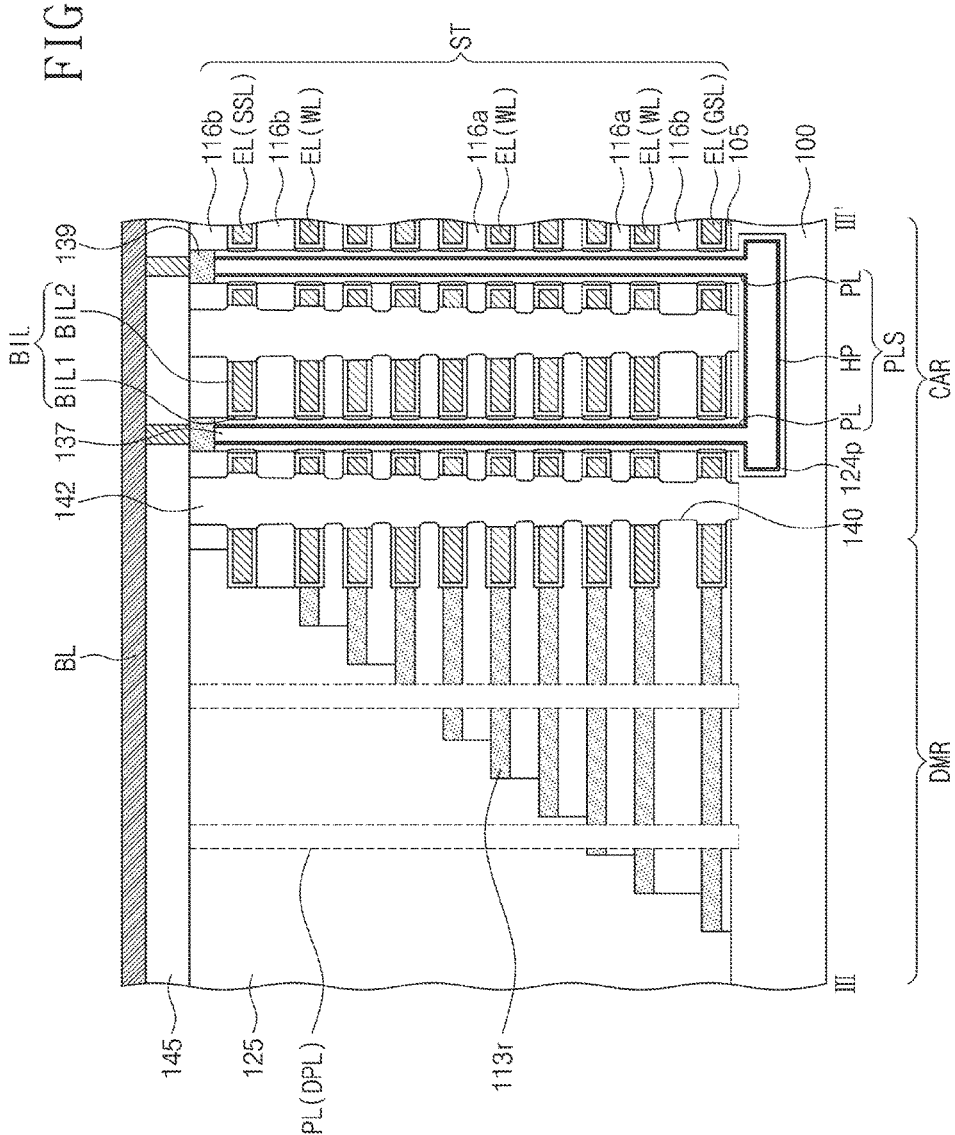

FIGS. 24A and 24B are cross-sectional views corresponding to the lines II-II' and III-III' of FIG. 20, respectively, to illustrate a semiconductor device according to some example embodiments of inventive concepts. Hereinafter, the descriptions to the same technical features as in the embodiments of FIGS. 4, 5A, 20, and 21A to 21D will be omitted or mentioned briefly for the purpose of ease and convenience in explanation.

Referring to FIGS. 24A and 24B, a pillar structure PLS may penetrate stack structures ST adjacent to each other. The pillar structure PLS may include a pair of vertical pillars PL penetrating the adjacent stack structures ST, respectively, and a horizontal connection portion HP disposed under the adjacent stack structures ST to connect the pair of vertical pillars PL to each other. The pair of vertical pillars PL may be provided in vertical holes 120 penetrating the adjacent stack structures ST, respectively. The horizontal connection portion HP may be provided in a recess region formed in an upper portion of the substrate 100. The horizontal connection portion HP may be provided between the substrate 100 and the stack structures ST to connect the pair of vertical pillars PL.

In some example embodiments, the horizontal connection portion HP may have a hollow pipe or macaroni shape continuously connected to the pair of vertical pillars PL. In other words, the pair of vertical pillars PL and the horizontal connection portion HP may constitute a pipe shape in one body. In other words, the pair of vertical pillars PL and the horizontal connection portion HP may be formed of one semiconductor layer continuously extending without an interface. Here, the semiconductor layer may be formed of a semiconductor material having a crystal structure including at least one of a single-crystalline structure, an amorphous structure, or a poly-crystalline structure.

An isolation insulating layer 142 may be disposed in an isolation trench 140 between the stack structures ST adjacent to each other. The isolation insulating layer 142 may include, for example, a silicon oxide layer.

Figure 25:
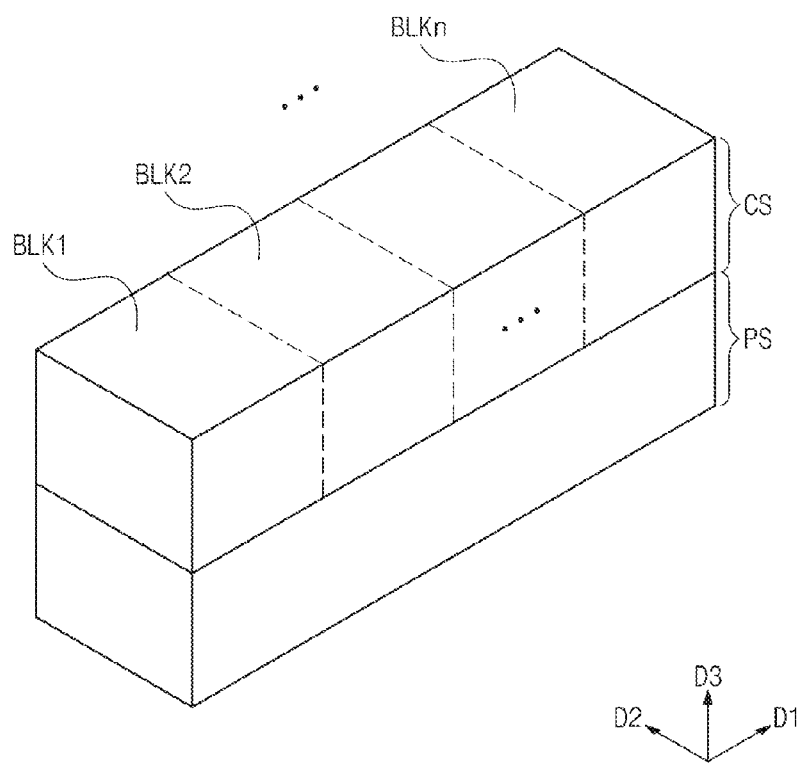
FIG. 25 is a schematic block diagram illustrating a semiconductor device according to some example embodiments of inventive concepts.

FIG. 25 is a schematic block diagram illustrating a semiconductor device according to some example embodiments of inventive concepts.

Referring to FIG. 25, a semiconductor device according to some example embodiments may include a peripheral logic structure PS and a cell array structure CS stacked on the peripheral logic structure PS. In other words, the cell array structure CS may overlap with the peripheral logic structure PS when viewed from a plan view.

In some example embodiments, the peripheral logic structure PS may include the row and column decoders, the page buffer, and/or the control circuits described with reference to FIG. 1. The cell array structure CS may include a plurality of memory blocks BLK1 to BLKn, each of which corresponds to a data erase unit. The memory blocks BLK1 to BLKn may include structures which are disposed on a plane defined by first and second directions D1 and D2 and are stacked along a third direction D3. Each of the memory blocks BLK1 to BLKn may include a memory cell array having a three-dimensional structure (or a vertical structure). The memory cell array may include a plurality of three-dimensionally arranged memory cells, a plurality of word lines, and a plurality of bit lines, which are described with reference to FIG. 2. The word lines and the bit lines may be electrically connected to the memory cells.

Figure 26A:
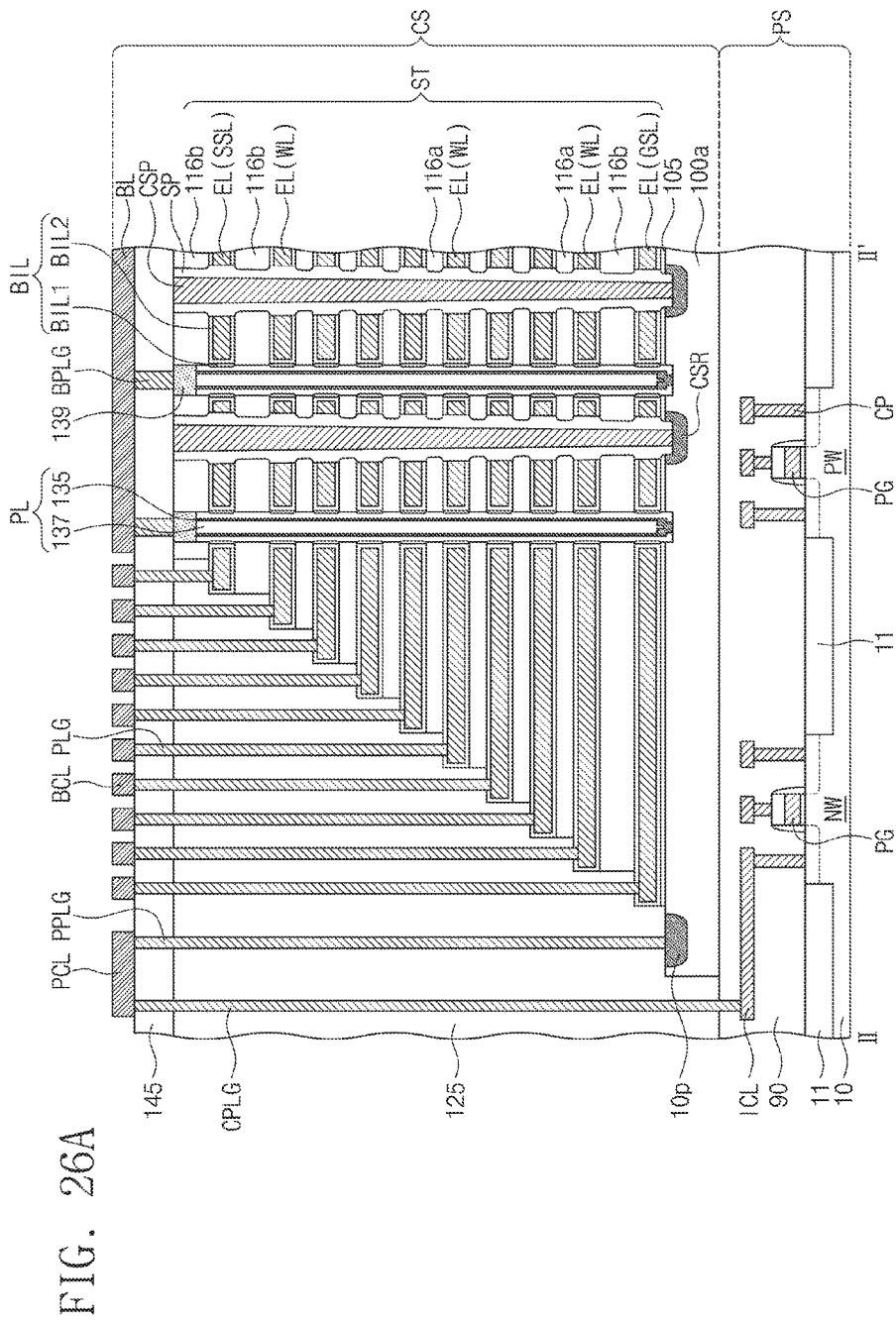
FIGS. 26A and 26B are cross-sectional views corresponding to the lines II-II' and III-III' of FIG. 20, respectively, to illustrate a semiconductor device according to some example embodiments of inventive concepts.
Figure 26B:
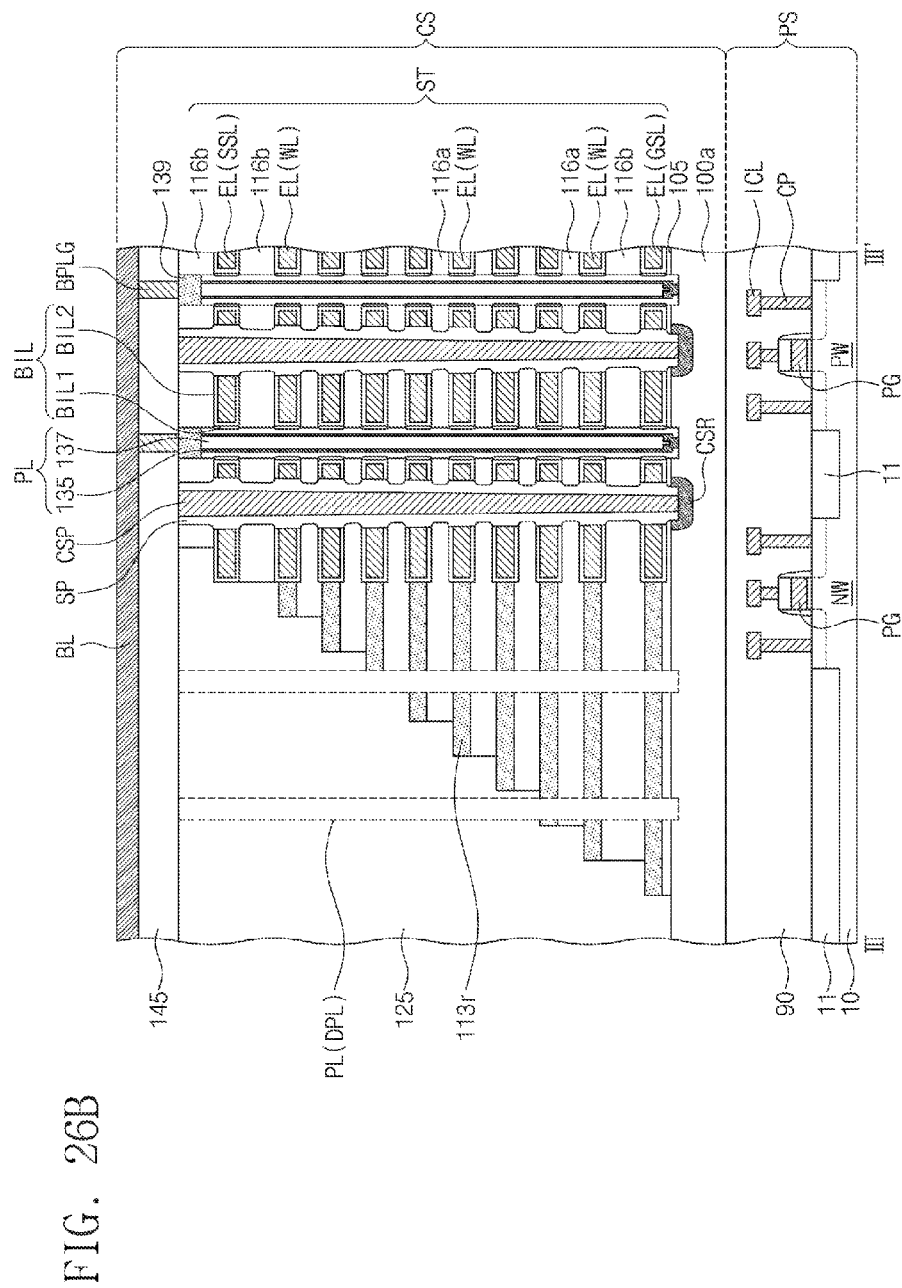

FIGS. 26A and 26B are cross-sectional views corresponding to the lines II-II' and III-III' of FIG. 20, respectively, to illustrate a semiconductor device according to some example embodiments of inventive concepts. Hereinafter, the descriptions to the same technical features as in FIGS. 4, 5A, 5B, 18, 19A, 19B, 20, and 21A to 21D will be omitted or mentioned briefly for the purpose of ease and convenience in explanation.

Referring to FIGS. 20, 26A, and 26B, a peripheral logic structure PS and a cell array structure CS may be sequentially stacked on a semiconductor substrate 10. In other words, the peripheral logic structure PS may be disposed between the semiconductor substrate 10 and the cell array structure CS when viewed from a cross-sectional view. That is, the cell array structure CS may overlap with the peripheral logic structure PS when viewed from a plan view.

The semiconductor substrate 10 may be a bulk silicon substrate, a silicon-on-insulator (SOI) substrate, a germanium substrate, a germanium-on-insulator (GOI) substrate, a silicon-germanium substrate, or a substrate having an epitaxial thin layer obtained by performing a selective epitaxial growth (SEG) process.

The peripheral logic structure PS may include the row and column decoders, the page buffer, and/or the control circuits described with reference to FIG. 1. In other words, the peripheral logic structure PS may include NMOS and PMOS transistors, a resistor, and a capacitor which are electrically connected to the cell array structure CS. The peripheral logic structure PS may be formed on a top surface of the semiconductor substrate 10. In addition, the semiconductor substrate 10 may include an N-well region NW doped with N-type dopants and a P-well region PW doped with P-type dopants. Active regions may be defined in the N-well region NW and the P-well region PW by a device isolation layer 11.

The peripheral logic structure PS may include peripheral gate electrodes PG, source and drain dopant regions at both sides of each of the peripheral gate electrodes PG, peripheral contact plugs CP, peripheral circuit interconnection lines ICL, and a lower filling insulation layer 90 covering the peripheral circuits. In detail, PMOS transistors may be formed on the N-well region NW, and NMOS transistors may be formed on the P-well region PW. The peripheral circuit interconnection lines ICL may be electrically connected to the peripheral circuits through the peripheral contact plugs CP. For example, the peripheral contact plugs CP and the peripheral circuit interconnection lines ICL may be electrically connected to the NMOS and PMOS transistors.

The lower filling insulation layer 90 may cover the peripheral circuits, the peripheral contact plugs CP, and the peripheral circuit interconnection lines ICL. The lower filling insulation layer 90 may include a plurality of stacked insulating layers.

The cell array structure CS may be disposed on the lower filling insulation layer 90 and may include a horizontal semiconductor layer 100a, stack structures ST, and vertical pillars PL.

The horizontal semiconductor layer 100a may be formed on a top surface of the lower filling insulation layer 90 covering the peripheral circuits. In other words, a bottom surface of the horizontal semiconductor layer 100a may be in contact with the lower filling insulation layer 90. The horizontal semiconductor layer 100a may include a cell array region CAR, contact regions CTR disposed at both sides of the cell array region CAR in a first direction D1, and dummy regions DMR disposed at both sides of the cell array region CAR in a second direction D2 perpendicular to the first direction D1.

The horizontal semiconductor layer 100a may be formed of a semiconductor material. For example, the horizontal semiconductor layer 100a may include at least one of silicon (Si), germanium (Ge), silicon-germanium (SiGe), gallium-arsenic (GaAs), indium-gallium-arsenic (InGaAs), aluminum-gallium-arsenic (AlGaAs), or any mixture thereof. The horizontal semiconductor layer 100a may include a semiconductor material doped with dopants of a first conductivity type and/or an intrinsic semiconductor material not doped with dopants. In addition, the horizontal semiconductor layer 100a may have a crystal structure including at least one of a single-crystalline structure, an amorphous structure, or a poly-crystalline structure.

The stack structures ST may extend in parallel to each other along a first direction D1 on the horizontal semiconductor layer 100a and may be spaced apart from each other in a second direction D2. Each of the stack structures ST may include gate electrodes EL vertically stacked on the horizontal semiconductor layer 100a and insulating patterns 116a and 116b disposed between the gate electrodes EL. The gate electrodes EL may include a string selection line SSL, word lines WL, and a ground selection line GSL. The insulating patterns 116a and 116b may include first insulating patterns 116a and second insulating patterns 116b, and the second insulating patterns 116b may be thicker than the first insulating patterns 116a. Thicknesses of the first insulating patterns 116a and a distance between the first insulating patterns 116a may be the same as described with reference to FIGS. 4 and 5A.

The stack structures ST may extend from the cell array region CAR onto the contact region CTR. The stack structures ST may have stepwise structures in the first direction D1 or a direction opposite to the first direction D1 on the contact region CTR. In addition, the stack structures ST may have stepwise structures in the second direction D2 or a direction opposite to the second direction D2 on the dummy region DMR.

The stack structures ST may include residual sacrificial patterns 113r on the dummy region DMR. Each of the residual sacrificial patterns 113r may be disposed between the insulating patterns 116a and 116b vertically adjacent to each other on the dummy region DMR and may be disposed horizontally at a side of each of the gate electrodes EL on the dummy region DMR. In addition, each of the insulating patterns 116a and 116b of the dummy region DMR may include a first portion P1 disposed between the gate electrodes EL vertically adjacent to each other and a second portion P2 disposed between the residual sacrificial patterns 113r vertically adjacent to each other. The second portion P2 may be thicker than the first portion P1. A thickness of the residual sacrificial pattern 113r, a thickness of the second portion P2 of the first insulating pattern 116a, and a ratio thereof may be the same as described with reference to FIGS. 21A to 21D.

An upper filling insulation layer 125 may be disposed on the horizontal semiconductor layer 100a to cover end portions of the gate electrodes EL constituting the stepwise structure. In addition, a capping insulating layer 145 may cover a plurality of the stack structures ST and the upper filling insulation layer 125. Furthermore, bit lines BL may be disposed on the capping insulating layer 145 and may extend in the second direction D2 to intersect the stack structures ST. The bit lines BL may be electrically connected to the vertical pillars PL through bit line contact plugs BPLG on the cell array region CAR.

The vertical pillars PL may penetrate the stack structures ST so as to be electrically connected to the horizontal semiconductor layer 100a. For example, the vertical pillars PL may penetrate the stack structures ST so as to be in contact with the horizontal semiconductor layer 100a. In some example embodiments, the vertical pillars PL may include a semiconductor material. Bottom surfaces of the vertical pillars PL may be disposed at a level between a top surface and a bottom surface of the horizontal semiconductor layer 100a. Conductive pads 139 connected to the bit line contact plugs BPLG may be disposed on top ends of the vertical pillars PL, respectively.

A data storage layer DS may be disposed between the stack structure ST and the vertical pillar PL. The data storage layer DS may be the same as described with reference to FIGS. 4 and 5A or FIGS. 4 and 5B.

Each of common source regions CSR may be disposed in the horizontal semiconductor layer 100a between the stack structures ST adjacent to each other. The common source regions CSR may extend in parallel to the stack structures ST in the first direction D1. The common source regions CSR may be formed by doping portions of the horizontal semiconductor layer 100a with dopants of a second conductivity type. For example, the common source regions CSR may include N-type dopants (e.g., arsenic (As) or phosphorus (P)).

A common source plug CSP may be connected to the common source region CSR. An insulating spacer SP may be disposed between the common source plug CSP and the stack structures ST. In some example embodiments, the common source plug CSP may extend in the first direction D1, and the insulating spacers SP may extend in the first direction D1 between the common source plug CSP and the stack structures ST. In some example embodiments, the insulating spacer SP may fill a space between the stack structures ST adjacent to each other, and the common source plug CSP may penetrate the insulating spacer SP so as to be locally connected to the common source region CSR.

Pick-up regions 10p may be disposed in the horizontal semiconductor layer 100a and may be adjacent to the cell array structure CS. The pick-up regions 10p may be disposed to be adjacent to both ends of each of the stack structures ST. In other words, the pick-up regions 10p may be spaced apart from each other in the first direction D1. The pick-up regions 10p may be formed by doping portions of the horizontal semiconductor layer 100a with dopants of the first conductivity type. In other words, the pick-up regions 10p may have the same conductivity type as the horizontal semiconductor layer 100a. A dopant concentration of the pick-up regions 10p may be higher than a dopant concentration of the horizontal semiconductor layer 100a.

Contact plugs PLG and connection lines BCL may be disposed on the contact region CTR. Pick-up contact plugs PPLG may penetrate the upper filling insulation layer 125 so as to be connected to the pick-up regions 10p. Top surfaces of the pick-up contact plugs PPLG may be substantially coplanar with top surfaces of the contact plugs PLG. The pick-up contact plug PPLG may be electrically connected to the peripheral logic structure PS through a well conductive line PCL and a connection plug CPLG. The connection plug CPLG may electrically connect the cell array structure CS to the peripheral logic structure PS. The connection plug CPLG may penetrate the upper filling insulation layer 125 and the horizontal semiconductor layer 100a so as to be connected to the peripheral circuit interconnection line ICL of the peripheral logic structure PS.

According to some example embodiments of inventive concepts, since the sacrificial layers are formed to be thinner than the insulating layers, it is possible to inhibit the striation which may be generated at the inner sidewall of the vertical hole penetrating the sacrificial layers and the insulating layers. In addition, even though the thicknesses of the sacrificial layers are reduced, desired thicknesses of the word lines may be secured by the process of forming the enlarged gate regions.

Furthermore, the first blocking insulating layer may be formed after the formation of the enlarged gate regions, and thus it is possible to inhibit or prevent the etch damage of the first blocking insulating layer which may occur in the process of replacing the sacrificial layers with the gate electrodes. As a result, the characteristics of the memory cells may be improved to realize the semiconductor device with improved reliability.

While inventive concepts have been described with reference to some example embodiments, it will be apparent to those skilled in the art that various changes and modifications may be made without departing from the spirits and scopes of inventive concepts. Therefore, it should be understood that the example embodiments described above are not limiting, but illustrative. Thus, the scopes of inventive concepts are to be determined by the broadest permissible interpretation of the following claims and their equivalents, and shall not be restricted or limited by the foregoing description.

What is claimed is:
1. A semiconductor device comprising:
a substrate;
word lines vertically stacked on top of each other on the substrate;
insulating patterns between the word lines, each of the insulating patterns including a first portion between the word lines and a second portion extending from the first portion, a first thickness of the first portion being smaller than a second thickness of the second portion;
a vertical pillar connected to the substrate, the vertical pillar penetrating the word lines and the insulating patterns; and residual sacrificial patterns on the substrate at sides of the word lines, respectively, such that the second portions of the insulating patterns are between the residual sacrificial patterns.

2. The semiconductor device of claim 1, wherein
the residual sacrificial patterns have a third thickness that is smaller than the second thickness.

3. The semiconductor device of claim 2, wherein a ratio of the third thickness to the second thickness ranges from 0.55 to 0.95.

4. The semiconductor device of claim 2, wherein a distance between the first portions of two of the insulating patterns that are vertically adjacent to each other is greater than the third thickness.

5. The semiconductor device of claim 1, further comprising:
a high-k dielectric layer, wherein
the residual sacrificial patterns include first sidewalls, and
the high-k dielectric layer is between the first sidewalls of the residual sacrificial patterns and the word lines that are adjacent to the first sidewalls.

6. The semiconductor device of claim 5, wherein
the residual sacrificial patterns include second sidewalls opposite the first sidewalls, and
the second sidewalls of the residual sacrificial patterns are laterally spaced apart from each other in a plan view and define a stepwise structure.

7. The semiconductor device of claim 1, further comprising:
a charge storage layer between the vertical pillar and the word lines and between the vertical pillar and the insulating patterns; and
first blocking insulating layers between the charge storage layer and the word lines.

8. The semiconductor device of claim 7, wherein
each of the first blocking insulating layers includes a first sidewall facing the charge storage layer and a second sidewall facing the word lines, and
the first sidewall of the first blocking insulating layers has a convex shape toward the charge storage layer.

9. The semiconductor device of claim 7, further comprising:
second blocking insulating layers between the word lines and the first blocking insulating layers, respectively,
each of the second blocking insulating layers extends to cover a top surface and a bottom surface of a corresponding one of the word lines, and
the second blocking insulating layers include a material has a higher dielectric constant than a material of the first blocking insulating layers.

10. The semiconductor device of claim 7, further comprising:
protection insulating patterns between the charge storage layer and the insulating patterns, wherein
each of the protection insulating patterns contacts two of the first blocking insulating layers that are vertically adjacent to each other.

11. The semiconductor device of claim 10, wherein a material of the protection insulating patterns is the same as a material as the insulating patterns.

12. The semiconductor device of claim 1, further comprising:
bit lines on the word lines and extending in a direction intersecting the word lines,
wherein the vertical pillar is not connected to the bit lines.

13. The semiconductor device of claim 1, wherein the insulating patterns include a different material than a material of the residual sacrificial patterns.

14. A semiconductor device comprising:
a substrate including a cell array region and a dummy region;
a first stack structure on the substrate, the first stack structure including first word lines vertically stacked on top of each other on the cell array region and first insulating patterns between the first word lines;
a second stack structure on the substrate, the second stack structure including second word lines vertically stacked on top of each other on the dummy region, second insulating patterns between the second word lines, and residual sacrificial patterns at sides of the second word lines, respectively,
each of the second insulating patterns including a first portion between the second word lines and a second portion between the residual sacrificial patterns, the second portion extending from the first portion, and a first thickness of the first portion being smaller than a second thickness of the second portion; and
first and second vertical pillars connected to the substrate, the first vertical pillars penetrating the first stack structure, and the second vertical pillars penetrating the second stack structures.

15. The semiconductor device of claim 14, wherein the residual sacrificial patterns have a third thickness that is smaller than the second thickness.

16. A semiconductor device comprising:
a substrate including a cell array region;
a plurality of word lines and a plurality of insulating patterns alternately stacked on top of each other on the substrate,
a vertical distance between two adjacent insulating patterns among the plurality of insulating patterns being greater than a thickness of each of the two adjacent insulating patterns,
the plurality of word lines and the plurality of insulating patterns defining a plurality of vertical holes that are spaced apart from each other over the cell array region,
a plurality of vertical pillars in the plurality of vertical holes;
a plurality of charge storage layers in the plurality of vertical holes and surrounding the plurality of vertical pillars;
a plurality of first blocking insulating layers between the plurality of word lines and the plurality of charge storage layers;
a plurality of second blocking insulating layers between the plurality of first blocking insulating layers and the plurality of word lines; and
a plurality of protection patterns between the plurality of charge storage layers and the plurality of insulating patterns such that the plurality of protection patters and the plurality of first blocking insulating layers are alternately stacked on top of each other.

17. The semiconductor device of claim 16, wherein
each of the plurality of first blocking insulating layers includes a first sidewall having a convex shape and facing a corresponding one of the plurality of charge storage layers.

18. The semiconductor device of claim 16, wherein each of the second blocking insulating layers extends to cover a top surface, a side surface, and a bottom surface of a corresponding one of the plurality of word lines.

19. The semiconductor device of claim 16, further comprising:
- a plurality of residual sacrificial patterns on a dummy region of the substrate, wherein
- the plurality of residual sacrificial patterns are spaced apart from each other at heights corresponding to the plurality of word lines,
- the plurality of insulating patterns include first portions that are alternately stacked with the plurality of word lines on the cell array region and second portions that extend laterally from the first portions over the dummy region, and
- the second portions of the plurality of insulating patterns are alternately stacked with the plurality of residual sacrificial patterns on the dummy region.

20. The semiconductor device of claim 19, wherein the plurality of insulating patterns are thicker at the second portions than the first portions.

* * * * *